United States Patent
Lu et al.

(10) Patent No.: US 6,230,235 B1
(45) Date of Patent: May 8, 2001

(54) ADDRESS LOOKUP DRAM AGING

(75) Inventors: Hsuehchung Shelton Lu, Milpitas; David Keene, San Carlos, both of CA (US)

(73) Assignee: Apache Systems, Inc., San Jose, CA (US)

( * ) Notice: Subject to any disclaimer, the term of this patent is extended or adjusted under 35 U.S.C. 154(b) by 0 days.

(21) Appl. No.: 09/163,074

(22) Filed: Sep. 29, 1998

Related U.S. Application Data

(63) Continuation-in-part of application No. 08/694,922, filed on Aug. 8, 1996, now Pat. No. 5,877,780, and a continuation-in-part of application No. 08/694,646, filed on Aug. 8, 1996, now Pat. No. 6,023,745.

(51) Int. Cl.[7] .................................................. G06F 12/00
(52) U.S. Cl. ........................... 711/106; 711/105; 711/104; 711/155; 365/222
(58) Field of Search ................................... 711/105, 106, 711/104, 155; 365/230.03, 203, 222

(56) References Cited

U.S. PATENT DOCUMENTS

| | | | |
|---|---|---|---|
| 4,839,796 | 6/1989 | Rorden et al. | 364/200 |
| 4,862,392 | 8/1989 | Steiner | 364/522 |
| 4,937,791 | 6/1990 | Steele et al. | 365/230 |
| 5,051,889 | 9/1991 | Fung et al. | 364/200 |
| 5,301,162 | 4/1994 | Shimizu | 365/230.03 |
| 5,321,652 | 6/1994 | Ito | 365/189.07 |
| 5,388,207 | 2/1995 | Chia et al. | 395/164 |
| 5,440,710 | 8/1995 | Richter et al. | 711/207 |
| 5,446,691 | 8/1995 | North et al. | 365/189.02 |
| 5,473,566 | 12/1995 | Rao | 365/189.12 |
| 5,473,573 | 12/1995 | Rao | 365/230.01 |
| 5,502,808 | 3/1996 | Goddard et al. | 395/162 |
| 5,528,751 | 6/1996 | Priem et al. | 345/509 |
| 5,557,752 | 9/1996 | Remion | 395/285 |
| 5,566,318 | 10/1996 | Joseph | 395/445 |
| 5,572,655 | 11/1996 | Tuljapurkar et al. | 345/509 |
| 5,581,513 | 12/1996 | Rao | 365/238.5 |
| 5,699,317 | * 12/1997 | Sartore et al. | 365/230.06 |
| 5,732,236 | 3/1998 | Nguyen et al. | 395/405 |
| 5,781,200 | 7/1998 | Lu et al. | 345/516 |
| 5,809,539 | 9/1998 | Sakakibara et al. | 711/151 |
| 5,844,849 | * 12/1998 | Furutani | 365/194 |
| 5,978,304 | * 11/1999 | Crafts | 365/230.03 |

* cited by examiner

*Primary Examiner*—Matthew Kim
*Assistant Examiner*—Pierre M. Vital
(74) *Attorney, Agent, or Firm*—Fulbright & Jaworski

(57) ABSTRACT

Systems and methods are described for network address lookup entry aging in a DRAM memory. A method of DRAM data aging includes: refreshing a row of memory cells in an array of DRAM memory cells. The refreshing periodically includes aging all entries that are stored in the row of memory cells. The systems and methods provide advantages in that an existing operation is used for an additional function. In addition, the aging can be implemented with closely coupled logic using the sense amplifiers.

6 Claims, 28 Drawing Sheets

Age command: performed on a row basis
8 CAM entries at a time

1300

1310

| 7 | 15 | 23 | 31 | 39 | 47 | (7) |
|---|----|----|----|----|----|-----|
| 6 | 14 | 22 | 30 | 38 | 46 | (6) |
| 5 | 13 | 21 | 29 | 37 | 45 | (5) |
| 4 | 12 | 20 | 28 | 36 | 44 | (4) |
| 3 | 11 | 19 | 27 | 35 | 43 | (3) |
| 2 | 10 | 18 | 26 | 34 | 42 | (2) |
| 1 | 9  | 17 | 25 | 33 | 41 | (1) |
| 0 | 8  | 16 | 24 | 32 | 40 | (0) |

```
         ←——— 1520 ————→
1510         
  ↘    | 00 | 02 | 04 | 06 | 08 |— 1530
       | 10 | 12 | 14 | 00 | 02 |— 1531
       | 04 | 06 | 08 | 10 | 12 |— 1532
       | 14 | 00 | 02 | 04 | 06 |— 1533
       | 08 | 10 | 12 | 14 | 00 |— 1534
       | 02 | 04 | 06 | 08 | 10 |— 1535
       | 12 | 14 | 00 | 02 | 04 |— 1536
       | 06 | 08 | 10 | 12 | 14 |— 1537
       Repeat
```

| 00 | 02 | 04 | 06 | 08 | 10 | 12 | 14 | 00 | 02 |
|----|----|----|----|----|----|----|----|----|----|
| 04 | 08 | 08 | 10 | 12 | 14 | 00 | 02 | 04 | 06 |
| 08 | 10 | 12 | 14 | 00 | 02 | 04 | 06 | 08 | 10 |
| 12 | 14 | 00 | 02 | 04 | 06 | 08 | 10 | 12 | 14 |

| ←───1820b───→ | | | | | | | |
|---|---|---|---|---|---|---|---|
| 08.50 | 08.75 | 10.00 | 10.25 | 10.50 | 10.75 | 12.00 | 1830 |
| 04.75 | 06.00 | 06.25 | 06.50 | 06.75 | 08.00 | 08.25 | 1831 |
| 02.00 | 02.25 | 02.50 | 02.75 | 04.00 | 04.25 | 04.50 | 1832 |
| 14.25 | 14.50 | 14.75 | 00.00 | 00.25 | 00.50 | 00.75 | 1833 |
| 10.50 | 10.75 | 12.00 | 12.25 | 12.50 | 12.75 | 14.00 | 1834 |
| 06.75 | 08.00 | 08.25 | 08.50 | 08.75 | 10.00 | 10.25 | 1835 |
| 04.00 | 04.25 | 04.50 | 04.75 | 06.00 | 06.25 | 06.50 | 1836 |
| 00.25 | 00.50 | 00.75 | 02.00 | 02.25 | 02.50 | 02.75 | 1837 |
| 12.50 | 12.75 | 14.00 | 14.25 | 14.50 | 14.75 | 00.00 | 1838 |
| 08.75 | 10.00 | 10.25 | 10.50 | 10.75 | 12.00 | 12.25 | 1839 |
| 06.00 | 06.25 | 06.50 | 06.75 | 08.00 | 08.25 | 08.50 | 1840 |
| 02.25 | 02.50 | 02.75 | 04.00 | 04.25 | 04.50 | 04.75 | 1841 |
| 14.50 | 14.75 | 00.00 | 00.25 | 00.50 | 00.75 | 02.00 | 1842 |
| 10.75 | 12.00 | 12.25 | 12.50 | 12.75 | 14.00 | 14.25 | 1843 |
| 08.00 | 08.25 | 08.50 | 08.75 | 10.00 | 10.25 | 10.50 | 1844 |
| 04.25 | 04.50 | 04.75 | 06.00 | 06.25 | 06.50 | 06.75 | 1845 |
| 00.50 | 00.75 | 02.00 | 02.25 | 02.50 | 02.75 | 04.00 | 1846 |
| 12.75 | 14.00 | 14.25 | 14.50 | 14.75 | 00.00 | 00.25 | 1847 |
| 10.00 | 10.25 | 10.50 | 10.75 | 12.00 | 12.25 | 12.50 | 1848 |
| 06.25 | 06.50 | 06.75 | 08.00 | 08.25 | 08.50 | 08.75 | 1849 |
| 02.50 | 02.75 | 04.00 | 04.25 | 04.50 | 04.75 | 06.00 | 1850 |
| 14.75 | 00.00 | 00.25 | 00.50 | 0075 | 02.00 | 02.25 | 1851 |
| 12.00 | 12.25 | 12.50 | 12.75 | 14.00 | 14.25 | 14.50 | 1852 |
| 08.25 | 08.50 | 08.75 | 10.00 | 10.25 | 10.50 | 10.75 | 1853 |

Repeat

ADDRESS LOOKUP DRAM AGING

CROSS-REFERENCES TO RELATED APPLICATIONS

This application is a continuation-in-part under 35 U.S.C. § 120 of both U.S. Ser. No. 08/694,922, filed Aug. 8, 1996, now U.S. Pat. No. 5,877,780 and U.S. Ser. No. 08/694,646, filed Aug. 8, 1996, now U.S. Pat. No. 6,023,745 the entire contents of both of which are hereby incorporated herein by reference as if fully set forth herein.

BACKGROUND OF THE INVENTION

1. Field of the Invention

The invention pertains to a DRAM architecture that has multiple DRAMs on the same chip, each of which can be accessed independently and simultaneously for performing different tasks and whereby more than one array of a particular DRAM memory can be opened at the same time.

2. Discussion of the Related Art

Computers can generally be broken into three main components: input/output (I/O) for interfacing the computer with external devices (e.g., monitor, mouse, keyboard, modem, etc.), a central processing unit (CPU) for processing data, and memory for storing the data. The dominant type of memory used in most computer systems today consists primarily of dynamic random access memory (DRAM). DRAMs are preferred because of their relatively low cost of production and high storage density. Traditionally, DRAMs were used to store text, computer programs, and numerical data. But as computer systems became faster, more powerful, and more versatile, there was a corresponding requirement to have larger and larger memories to handle the increased volumes of data. Today, there is a huge demand for additional memory in order to satisfy the demands imposed by video, audio, and graphics applications. This multimedia information consumes vast amounts of memory for storage.

Fortunately, advances in semiconductor manufacturing processes have substantially increased the capacity of DRAM chips, while costs have dropped on a per byte basis. In the past few years, DRAM chip storage capacity have exploded from storing 256 Kbytes, 1 Mbyte, 4 Mbytes, 16 Mbytes, . . . to 256 Mbytes of data. Indeed, the production of 1 Gigabyte DRAM chips is imminent.

However, the speed (i.e., bandwidth) at which data stored in the DRAMs can be accessed has not kept pace with demands. Video and audio recording and playback, three-dimensional graphics generation, real-time teleconferencing, on-the-fly interactive simulations, etc., all require the transfer of huge amounts of data between the processor(s) and memory. Unfortunately, the amount of data which can be accessed from the DRAM is quite limited. This limitation is attributable to the fact that the basic DRAM controller scheme has generally remained the same over the past twenty years. The same scheme that was originally developed for controlling 8 Kbyte DRAMs is now being applied to 256 Mbyte DRAMs. What was sufficient twenty years ago is totally inadequate to meet today's technology. A proper analogy is that of a parking lot where the number of parking spaces has increased a thousandfold, but yet there is still only one tollgate through which all cars must pass.

FIG. 1 shows a typical architecture of a prior art DRAM layout. Cell array 101 is comprised of a 128×128 array of memory cells. An individual memory cell consists of a transistor which causes a tiny capacitor to be placed in either a charged (i.e., "1") or discharged (i.e., "0") state. Thereby, a single memory cell is capable of being programmed to store one bit of information. Hence, this particular 128×128 cell array is capable of storing 16 Kbits of data. The memory cells are arranged in rows and columns. Seven address lines ($2^7=128$) are used to specify a particular memory cell for access. These seven address lines (e.g., A0–A6/A7–A13) are multiplexed to provide a 14-bit address by using a row address strobe (RAS) signal and a column address strobe (CAS) signal. The RAS signal is used to clock addresses A0–A6 to the row address register 102. The row address decoder 103 decodes the address and specifies one of the 128 rows for access. Similarly, the CAS signal is used to clock addresses A7–A13 to the column address register 104. The column address decoder 105 decodes the address and specifies one of the 128 columns for access. Once a particular cell is specified by decoding its row and column, a read/write (R/W) signal is used to specify whether a bit is to be written into that cell via DATA IN, or the bit retained by that cell is to be read out via DATA OUT.

In the past, designers have sought to increase the bandwidth of their DRAM architecture by implementing wider address and data buses. FIG. 2 shows a prior art memory architecture having wide buses. However, this workaround solution has a couple of drawbacks. First, it requires more board space to physically route the wider buses. Wider buses consume precious area on an already crammed motherboard. Second, wider buses require a corresponding increase in the number of pins for the memory chips and microprocessor. A higher pin count mandates larger chip packages. Again, larger chips consume valuable area on the motherboard. It may be physically impossible to insert these larger chips onto the printed circuit board. The practical limitation of how wide buses can attain is approximately 64 or 128 bits wide. Beyond this bus width, it becomes too unwieldy.

Designers have also attempted to increase the DRAM bandwidth by implementing high speed special DRAMs. Although these specialized DRAMs can achieve relatively high peak bandwidths, it is difficult to sustain these peak bandwidths over time due to the nature of their page misses. Generally, data is stored in a "page" format within the DRAM, whereby an entire page must be "opened" in order to access the piece of desired data residing within that page. If the requested data is not in the currently opened page, a page "miss" occurs. Page misses require a lot of time to service because an entire RAS/CAS cycle must be performed in order to close the current page and open the new page containing the desired data. Hence, page misses severely impact the specialized DRAMs' bandwidth. It is virtually impossible to avoid page misses because the specialized DRAMs typically implement the traditional RAS/CAS scheme. As such, there is minimal or no capability to perform a page open look-ahead due to the fact that the page open (RAS) and read/write (CAS, OE) operations have to be performed in sequence and over the same address bus.

Moreover, since specialized DRAMs have an inordinate number of pins (e.g., 80+ pins) to accommodate their complex interface, there is usually just one single on-chip DRAM controller. This same controller is used to access different types of information. The different types of information are typically stored and accessed from the same DRAM. As a result, there is a relatively high page miss rate as the controller switches between the different types of data. For example, a two-dimensional drawing operation might require different page locations for operands that are required at the same time. Consequently, the DRAM controller normally includes a large FIFO buffer in order to balance the memory accesses with the drawing engine operations. Furthermore, a large percentage of PC Windows applications require rectangular types of operations. A readmodify-write operation is often necessary to determine whether selected pixels are to be changed. These kinds of operations require multiple access to the DRAM (i.e., read and write) and effectively cuts the critical DRAM bandwidth in half.

Thus, there is a need in the prior art for a new high-capacity DRAM architecture that also has a sustainable high bandwidth. The invention provides an elegant solution by implementing a DRAM architecture having multiple DRAMs with multiple arrays. In the invention, each of the on-chip DRAMs has its own address, data, and control lines. Hence, the DRAMs can be accessed independently and simultaneously for executing different tasks. Furthermore, in the invention, each DRAM is divided into multiple arrays, which once opened, stays open. Each of the arrays has its own circuitry that performs page open and circuitry that performs read/write. Hence, page open and read/write operations can be performed simultaneously within the same RAM. These improvements greatly minimize page misses, thus yielding a much greater DRAM bandwidth. In addition, each memory array is accompanied by byte write enable lines that control which portion of write data is actually updated into the DRAM array. This byte write enable lines can change every clock that in real application converts read-modify-write cycle into write cycle. This reduction of memory access (from 2 to 1) provides more memory bandwidth for controller to access data.

SUMMARY OF THE INVENTION

The invention pertains to a semiconductor chip having two or more memory sections, whereby one of the sections is divided into a number of separate arrays. Data is stored in a particular memory depending on its associated task. For instance, pixel data is stored in a frame buffer memory, whereas data relating to pattern, cursor, and video line buffers are stored in an auxiliary memory. These two separate sections of memory have their own set of address, read/write, activate, control and data lines. Hence, they can be accessed independently by the memory controller.

Furthermore, a memory can be configured into a number of distinct arrays. Two separate and distinct address buses are implemented to access these arrays. The first address bus is used to specify which of these arrays is to be activated. The other address bus is used to specify a particular array for performing either a read or write operation. These two address buses, in conjunction with activate, row, column, data, and read/write lines, enable the memory controller to activate one array while simultaneously reading from or writing to a different array. In addition, once an array is activated, it remains activated. This feature allows more than one array to be in an activated state at any given time.

BRIEF DESCRIPTION OF THE DRAWINGS

The invention is illustrated by way of example, and not by way of limitation, in the figures of the accompanying drawings and in which like reference numerals refer to similar elements and in which:

FIG. 13A is a logical block diagram of the memory storage arrangement of one of the eight memories of one implementation of the scoreboarding circuit of the invention.

FIG. 18A and FIG. 18B are illustrations of a memory configuration utilized by an embodiment of the invention for computer system graphic display modes utilizing 800 (horizontal)×600 (vertical)×8 bits per pixel using 50 columns per scan line.

FIG. 19 is an illustration of a memory configuration utilized by an embodiment of the invention for computer system graphic display modes utilizing 800 (horizontal)× 600 (vertical)×16 bits per pixel using 100 columns per scan line.

FIG. 20A and FIG. 20B are illustrations of a memory configuration utilized by an embodiment of the invention for computer system graphic display modes utilizing 800 (horizontal)×600 (vertical)×24 bits per pixel using 150 columns per scan line.

DETAILED DESCRIPTION OF THE INVENTION

A novel DRAM architecture having increased bandwidth is described. This architecture is built on the concepts of multiDRAM and concurrent arrays. The multiDRAM concept pertains to the incorporation of multiple DRAMs on a single chip, whereby each of the DRAMs can be accessed independently to perform different tasks. The concurrent array concept pertains to structuring the DRAMs into multiple arrays. Each DRAM has the capability of performing page open and read/write operations simultaneously. These two improvements allow the DRAM architecture of the invention to have access time approaching its peak bandwidth (e.g., 1.6 Gbytes/sec bandwidth for general graphics and video operations). In the following description, for purposes of explanation, numerous specific details are set forth in order to provide a thorough understanding of the invention. It will be obvious, however, to one skilled in the art that the invention may be practiced without these specific details. In other instances, well-known structures and devices are shown in block diagram form in order to avoid obscuring the invention.

Figure 1:
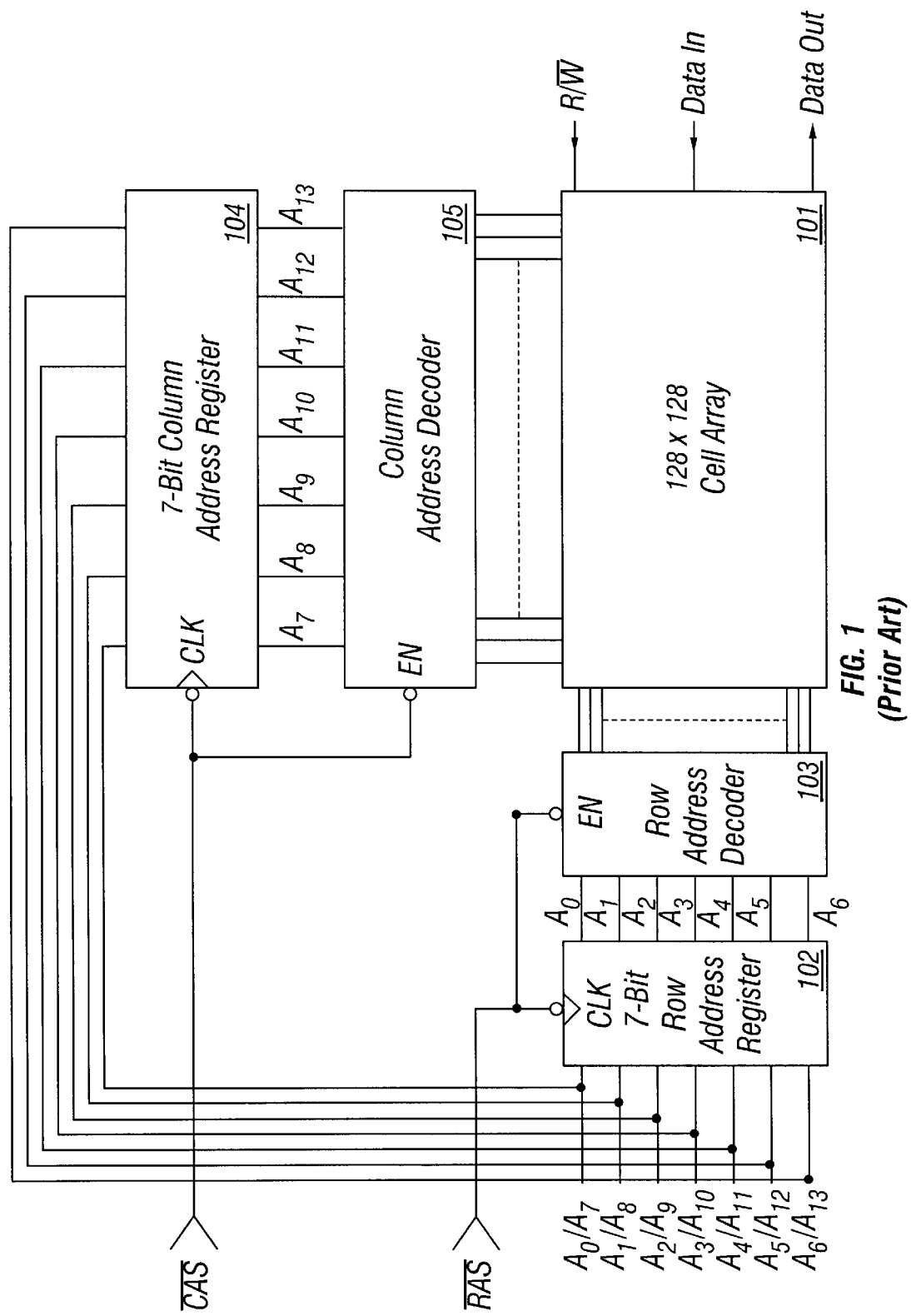
FIG. 1 shows a typical architecture of a prior art DRAM layout.
Figure 2:
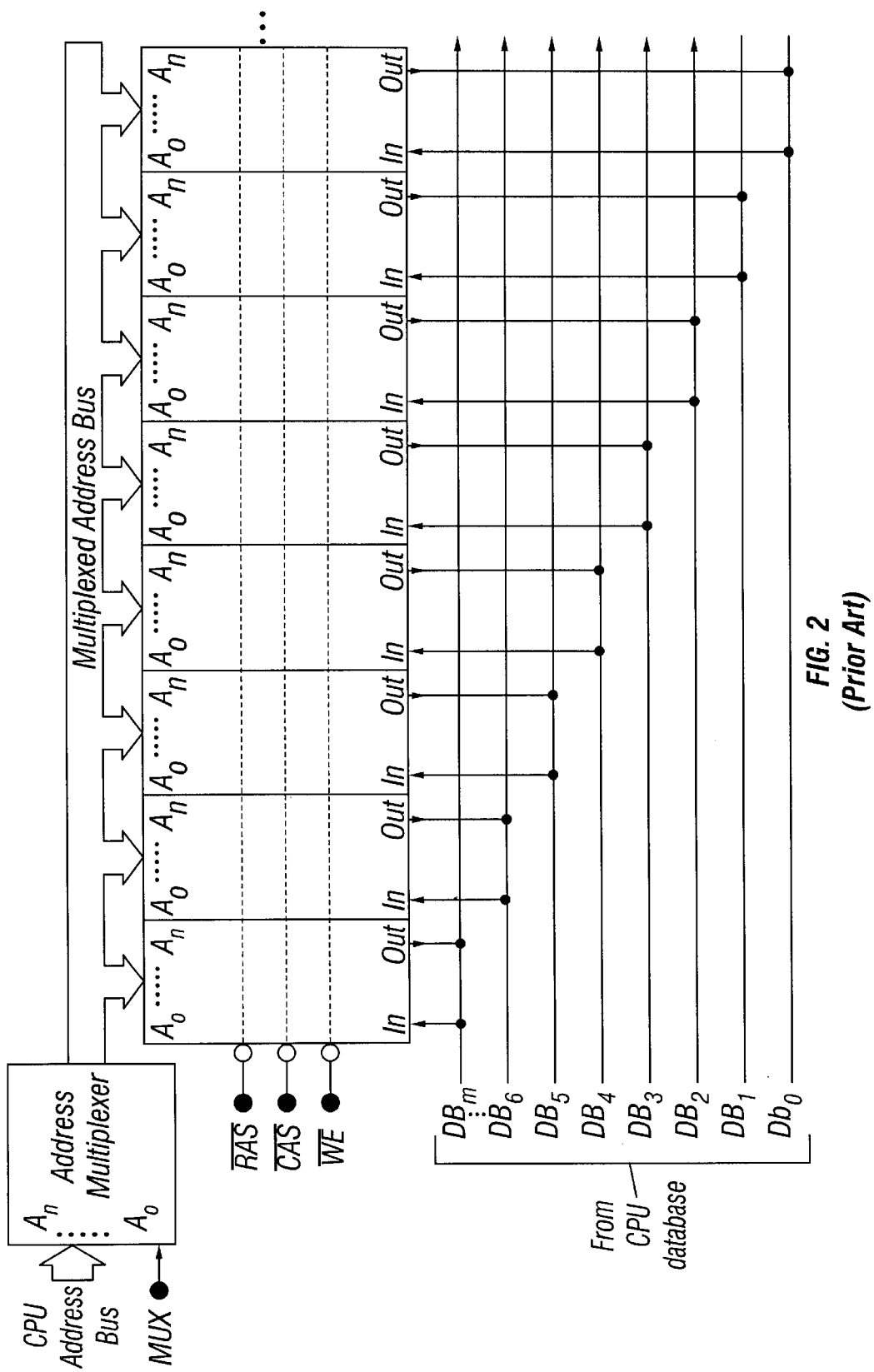
FIG. 2 shows a prior art memory architecture having wide buses.
Figure 3:
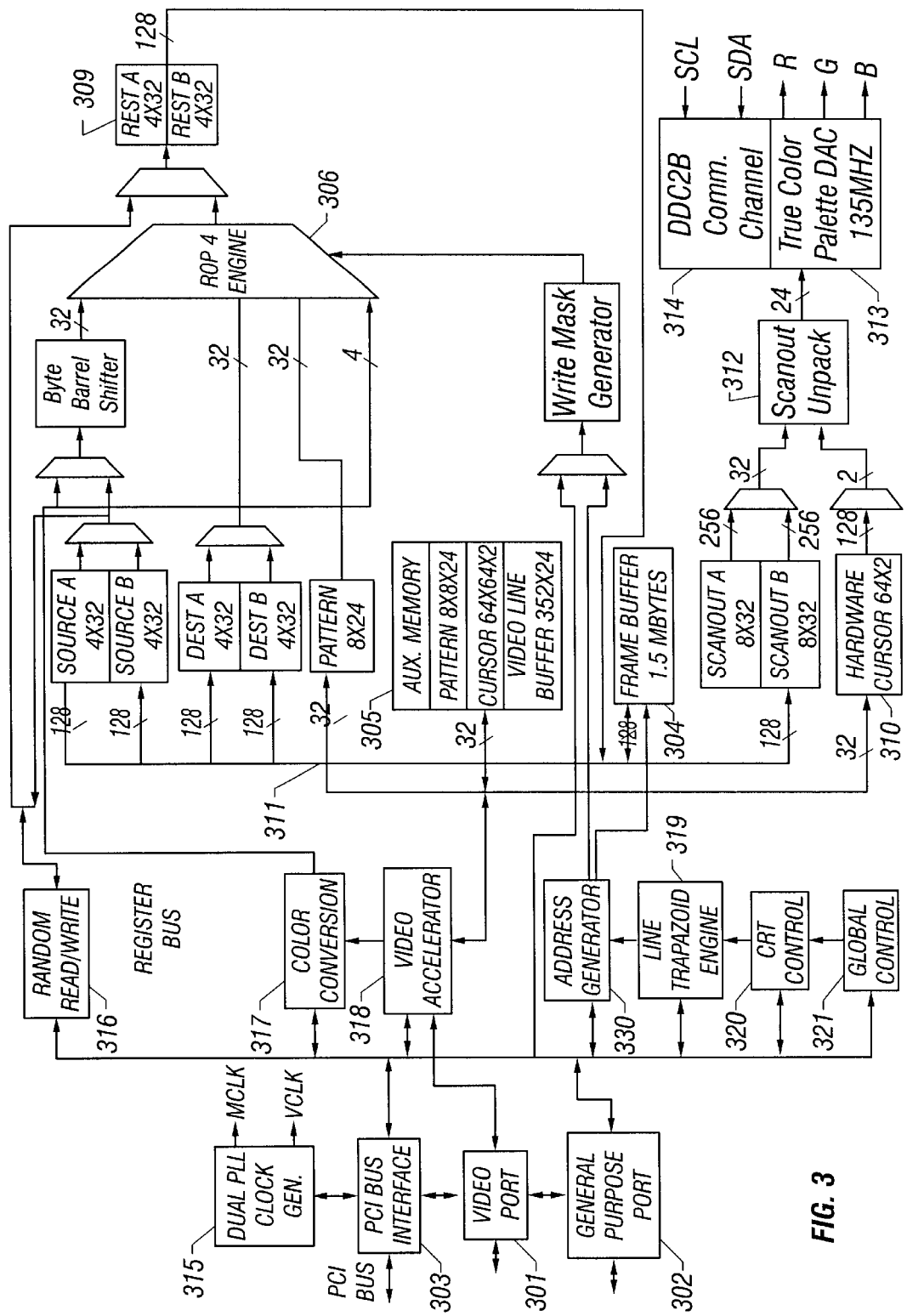
FIG. 3 shows a block diagram of a high-performance media processor chip upon which the invention may be practiced.

FIG. 3 shows a block diagram of a high-performance media processor chip upon which the invention may be practiced. External data can be input to the chip either through the video port 301, general purpose port 302, or the PCI interface 303. The input data is then stored in one of two independent DRAM memories that are available: a frame buffer memory 304 or a separate auxiliary memory 305. Exactly where the input data is ultimately stored, depends on the nature of the data. More particularly, frame buffer memory 304 contains the pixel data which is used to render images on a raster display. The size of frame buffer memory 304 depends on the size of the display and the number of bits assigned per pixel. A size of 1.5 Mbytes is sufficient for a 640×480 display with 24-bit pixel color values. In contrast, auxiliary memory 305 is a smaller piece of DRAM memory which is used to store data pertaining to the background pattern (e.g., style and color), cursor (e.g., shape, size, and color), and video line buffer. Either of these two DRAM memories can be independently accessed and controlled by address generator 330. The advantage of having two independently accessible DRAM memories is that now, two different tasks can be performed without suffering a page miss. For instance, data from frame buffer 304 can be accessed for drawing a window display. Meanwhile, data for drawing the background or cursor is accessible through the auxiliary memory 305.

The actual graphics operations are performed by the raster operation (ROP4) engine 306. Basically, the ROP4 engine 306 performs raster operations on the following four components: source, destination, pattern, and mask. In order to more efficiently execute various graphics operations which may be performed on a pixel or set of pixels, the ROP4 engine 306 is tightly coupled with frame buffer 304 and its associated registers: Source registers 307, Destination registers 308, Result registers 309, and Scanout registers 310. Frame buffer 304 outputs its data to the Source, Destination registers and Scanout 304–305 for associated read operations. In addition, frame buffer 304 accepts update data from the Results registers 309 for associated write operations coupled by byte write enable control lines. All read operations from and write operations to the frame buffer 304 are transmitted via the internal 128-bit bus 311. The associated registers 307–310 are all 128 bits wide. To improve efficiency, these four registers 307–310 are all double buffered (i.e., ResultA and Result, Source and Source B, etc.). Hence, if one of the two registers in this double-buffering scheme happens to be filled, operations can continue on the other register while the processor services the filled register. The Result register 309 (i.e., REST A and REST B) is loaded with data from the ROP4 engine 306 32-bits at a time. Data is passed out of the Source and Debt registers 307–308 as 32-bit words to the ROP4 engine 306. The 32-bit Mask and Pattern data are the other two inputs to the ROP4 engine 306. The ROP4 engine 306 consists of 32 identical functional units which perform boolean operations on the four inputs (i.e., Mask, Pattern, Source, and Debt) as instructed by the common control logic. The control logic provides a 16-bit RAP code which determines the one of 65,536 boolean functions of four variable to be performed. In the currently preferred embodiment, the MILK frequency is 100 MHz, and data passes through the ROP4 in less than 10 nsec so that 32 bits can be loaded into the result register on every clock.

Eventually, data from Frame Buffer 304 is output to the Scanout registers 310. Thereupon, Scanout Unpack circuit 312 takes the contents of Scanout registers 310 and performs a serialize function as well as VGA attribute controller functions. RAMDAC circuit 313 then converts the serialized digital data into analog RGB signals for display purposes. Plug and play monitor support is given by block 314. Other blocks housed within this chip include a dual phase-lock-loop clock generator which generates two clock signals. The MILK signal is used for memory accesses, whereas PCLK is used for the backend. The Random Read/Write block 316 supports any direct memory accesses to the Frame Buffer 304. Color Conversion block 317 performs color expansion, dithering, and data alignment. Video Accelerator 318 supports both YUV and RGB video formats. A Line Trapezoid Engine 319 is used to perform line and area fill operations. Timing information necessary for the monitor is given by CRT Controller 320. Global state information resides in the Global Control block 321, and Hardware Cursor block 322 overlays the cursor on top of the graphics.

Figure 4:
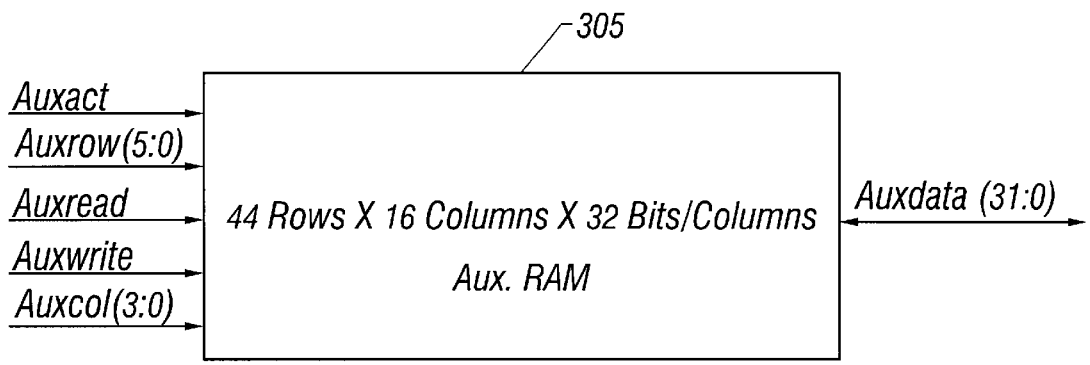
FIG. 4 shows a more detailed block diagram of the auxiliary memory.

FIG. 4 shows a more detailed block diagram of the auxiliary memory. Auxiliary memory 305 is similar to a conventional DRAM. In the currently preferred embodiment, there are 22 Kbits of memory which are configured as 44 rows×16 columns×32 bits/column. The 6-bit Auxrow(5:0) signal is used to select one of the 44 rows. The 4-bit Auxcol(3:0) signal gives the column address and is used to select one particular column. The Auxact, Auxread, and Auxwrite signals are used to initiate various operations, depending on their respective coding. A "000" code (i.e., Auxact=0, Auxread=0, and Auxwrite=0) corresponds to no valid operation. The data is kept latched with the sense amplifier intact. "A001" (i.e., Auxact=0, Auxread=0, and Auxwrite=1) decodes the Auxcol(3:0) signal to decide which column is to be written by the data on the Auxdata (31:0) bus. The column is then written to the activated row. A "010" decodes the Auxcol(3:0) signal to read one of the 16 columns from the sense amplifier latch and drives it onto the Auxdata(31:0) bus. A "100" latches and decodes the Auxrow(5:0) signal to open that page and latch the data at the sense amplifier. All other codes "011, 101, 110, and 111" correspond to an invalid operation.

Figure 5:
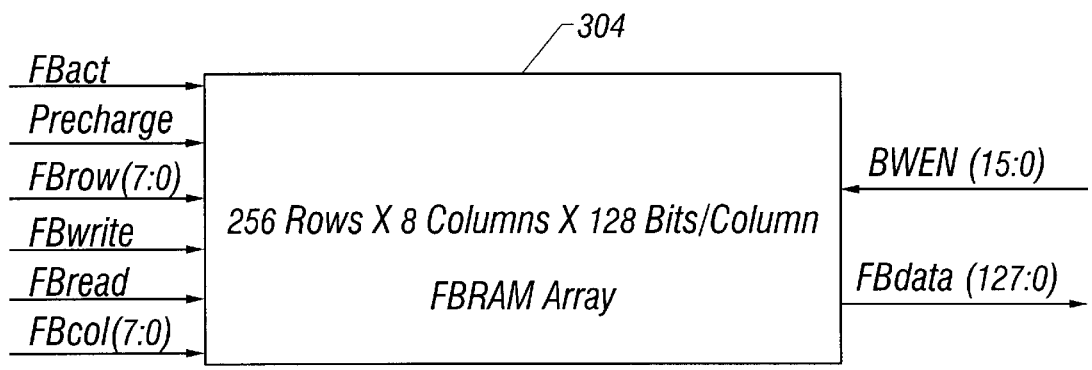
FIG. 5 shows a more detailed block diagram of the frame buffer memory.

FIG. 5 shows a more detailed block diagram of the frame buffer memory. The frame buffer memory is comprised of 256 rows×8 columns×128 bits/column, which are configured into a number of arrays. These arrays are accessed by the activate (act), read, and write signals. The activate signal of the invention initiates a page open operation to a designated array. Hence, the activate signal performs a function similar to that of a conventional RAS command. Each time that the activate command is asserted, there is a corresponding row address to specify which row or page is to be opened. In addition, each time a read or write command is asserted, there are column selectors associated to specify which column(s) to be read/written. Each time a page is activated (e.g., one out of 256 rows), the contents of that page are latched and stored by the corresponding sense amplifier. Asserting the FBread signal will cause a subsequent read operation to select one of the 8 columns of data from the sense amplifier and drive it onto the 128-bit frame buffer data bus 10 FBdata(127:0).

With the invention, data can be written to multiple columns at the same time. This is accomplished by overriding the specified column(s)' sense amplifiers during the write command with FBdata(127:0). The column(s) are driven back to the corresponding internal storage cells. The data write is further qualified by the Byte Write Enable BWEN (15:0) signal. Each bit in BWEN enables one byte of data to be written. There are 16 bytes of data in the 128-bit FBdata(127:0) signal. Consequently, there are 16 bits of BWEN associated with each write command. BWEN can change every clock thus giving the controller the power to convert a read-modify-write cycle into a write cycle only. This is very different from a conventional SGRAM write mask since SGRAM write masks comes from registers, it cannot change on the fly with data. The Precharge command invalidates the sense amplifier's latched data and forces it to an unknown state. If a read or write command applies to an array that is not activated (i.e., precharged), an error message is generated. Various operations are performed according to the code comprised of the FBact, FBread, FBwrite, and Precharge bits. A code of "0000" corresponds to no operation. Data latched by the sense amplifier is kept intact. A code of "0001" corresponds to an invalid sense amplifier data to an unknown state. A "0010" code causes the FBcol (7:0) to select columns that are going to be overridden by FBdata(127:0) with BWEN(15:0) qualifying write data on a byte granularity to the enabled columns of the active row. A "0100" code causes the FBcol(7:0) signal to select one of the 8 columns from the sense amplifier and drives the data onto the FBdata(127:0) bus. A "1000" code latches and decodes the FBrow(7:0) signal to open that page and latch data to the sense amplifiers. The array configuration described above can be instantiated 48 times. External decoders can be utilized to decode and qualify activate and read/write commands together with array, row, and column address to select one of the arrays for access. The FBrow, FBcol, BWEN, and FBdata signals can be tied together. During a read operation, the FBread signal can be used as an output enable; FBdata (127:0) is a bi-directional tri-state bus.

Figure 6:
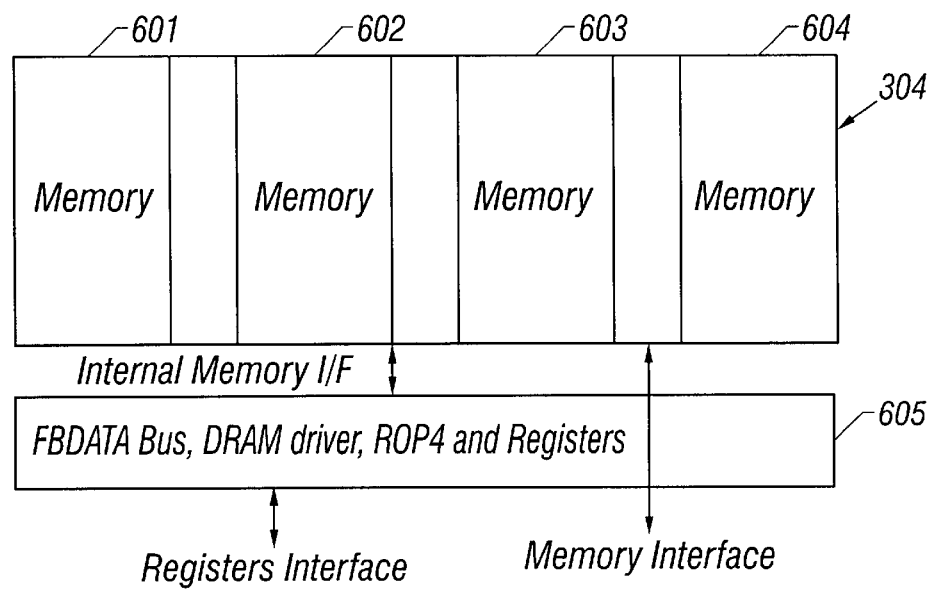
FIG. 6 shows a block diagram of the interface between the frame buffer and associated circuits.

FIG. 6 shows a block diagram of the interface between the frame buffer and associated circuits. In this particular embodiment, the frame buffer memory 304 is subdivided into four separate groups of arrays 601–604. A separate Registers interface and Memory interface are used to access these four array groups 601–604. In addition, an internal memory interface is used to couple the four array groups 601–604 to the FBDATA bus, DRAM driver, ROP4 engine, and Registers section 605.

Figure 7:
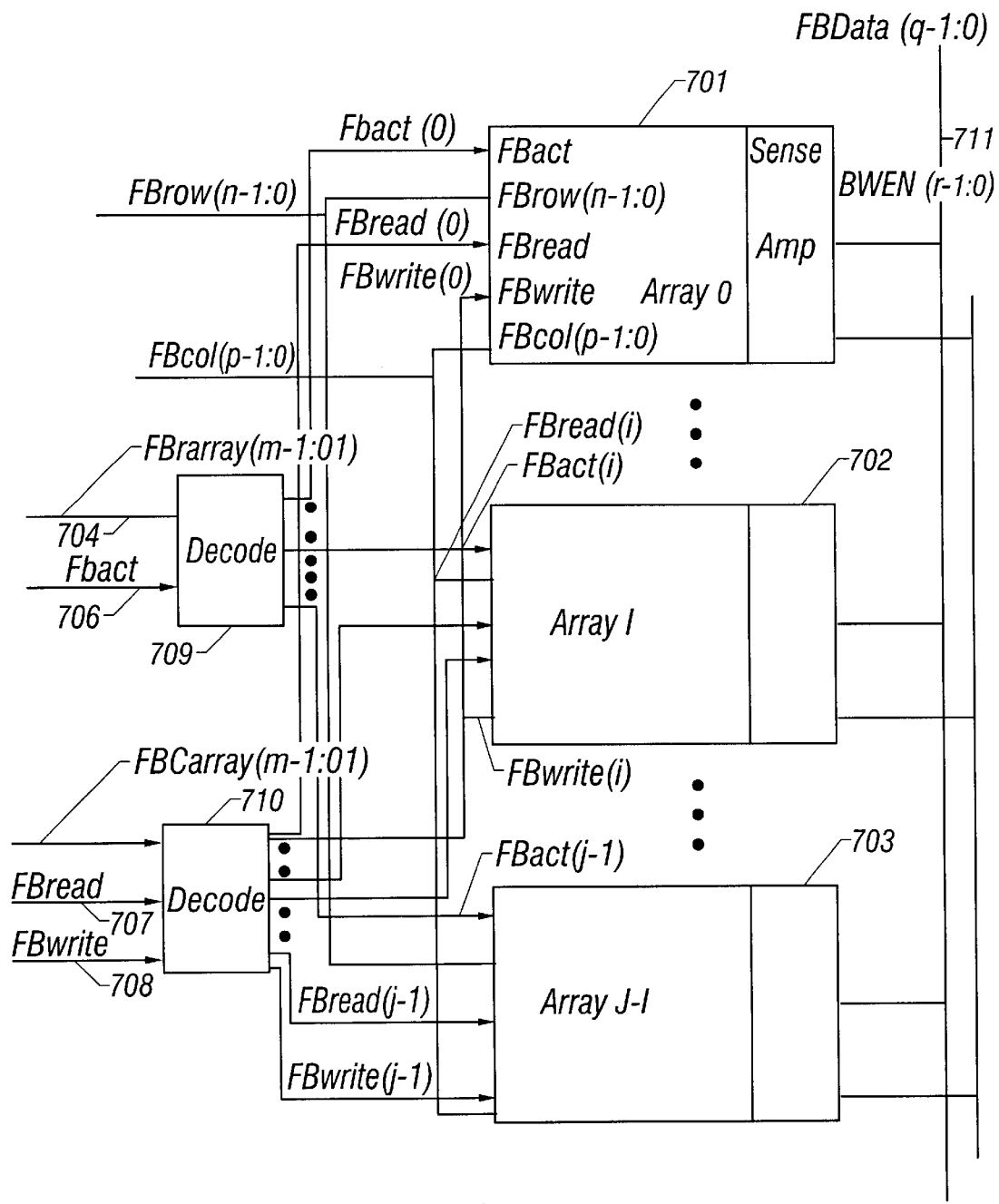
FIG. 7 shows a circuit diagram describing in detail the currently preferred decoding scheme associated with the frame buffer arrays.

FIG. 7 shows a circuit diagram describing in detail the currently preferred decoding scheme associated with the frame buffer arrays. Shown are J number of arrays (i.e., array 0 to array J–1). These J arrays are binary encoded by M bits (i.e., 0 to M-1). For example, assuming that there are 64 arrays, this means that the array address requires 6 bits. All of the arrays 701–703 connect to the same external row and column address buses. Two separate array address buses (i.e., FBrarray 704 and FBcarray 705) are used to perform different functions. The FBrarray bus 704 conveys address information specifying a particular array to be activated, whereas the FBcarray bus 705 specifies a particular array to which a read or write operation is to be performed. These two address buses, along with the FBact 706, FBread 707, and FBwrite 708 signals are input to the control decoders 709 and 710. Decoders 709 and 710 take these inputs and generate the appropriate FBact(0) to FBact(j–1); FBread(0) to FBread(j–1); and FBwrite(0) to FBwrite(j–1) signals for controlling array 0 to array J–1. Thereby, decoder 709 can activate one of the arrays 701–703, while decoder 710 can, at the same time, initiate a read/write operation to one of the arrays 701–703.

More specifically, the FBrarray address 704 decodes with the FBact signal 706 to generate the activate control for activating one array at a time.

The FBrow(n-1:0) signal 712 specifies a particular row of interest. Likewise, the FBcol(p-1:0) signal 713 specifies particular columns of interest. This set of addresses and control decoding (i.e., FBact, FBrow, and FBrarray) is used to activate (open) a row (page) of data. The FBcarray and FBcol address 705 decodes with the FBread 707 or FBwrite 708 signals to generate read or write control for one array at a time. The data output of all the arrays 701–703 connects to a q-bit wide, bi-directional common data bus FBData(q-1:0) 711. This set of address and control decoding, FBread/FBwrite/FBcol/FBcarray, is used to read data to FBdata bus 711 or write an array from the FBdata bus 711. It should be noted that FBread 707 and FBwrite 708 cannot be asserted simultaneously. However, with the invention, access to the frame buffer is accomplished so that no explicit precharge cycle is required. The array address of 5 bits (FIBrarray 704), row address of 8 bits (FBrow 712) and FBact 706 signals are used to activate a row at a given array. Once an array is active on some row, it remains active on that row until it is activated on a different row or until one of its neighboring arrays is activated. During column access for reading or writing, a 6-bit address (FBcarray 705) and an 8-bit decoded column select bus (FBcol 713) are used.

Figure 8:
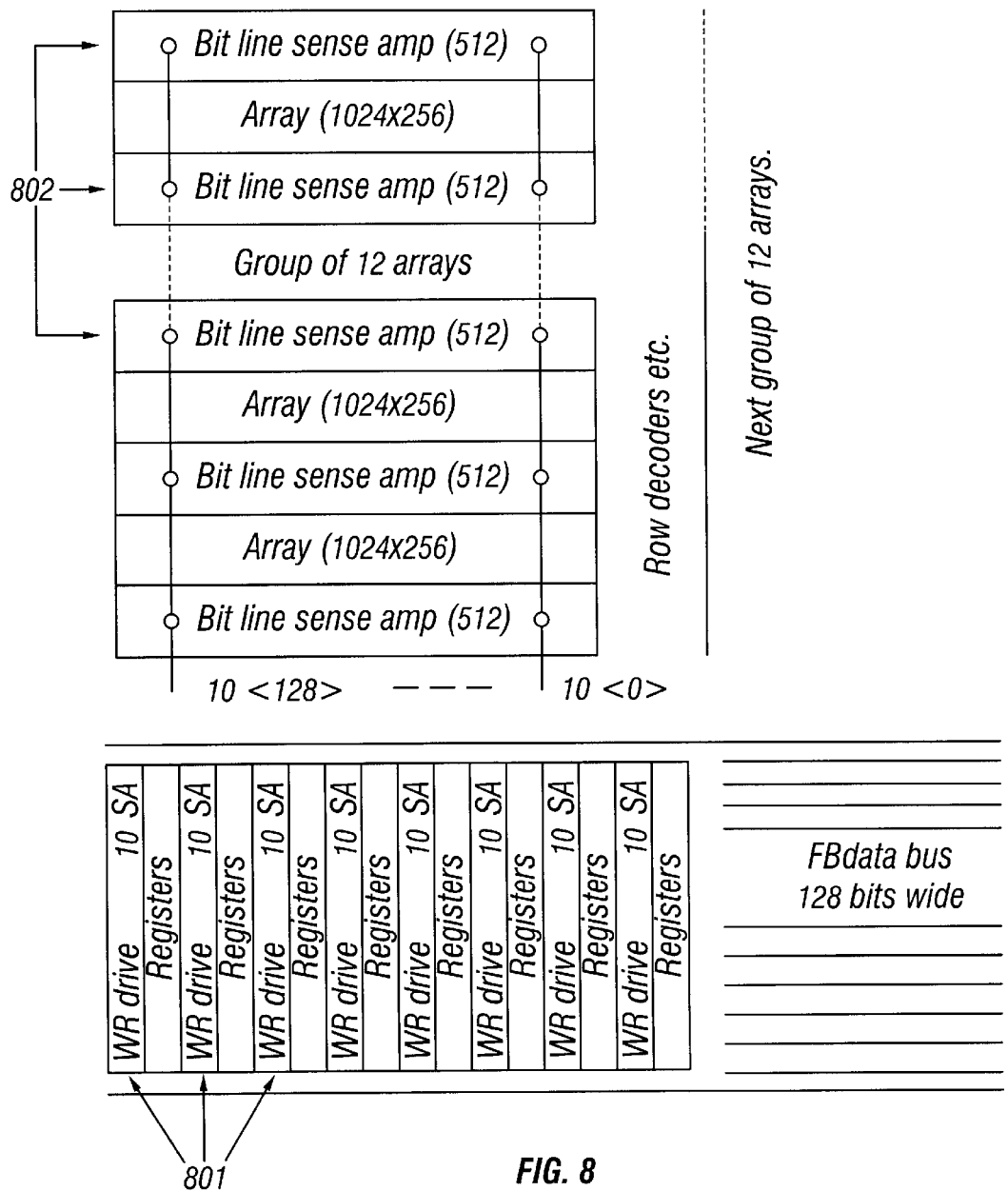
FIG. 8 shows a group of frame buffer arrays having a common I/O.

FIG. 8 shows a group of frame buffer arrays having a common I/O. In the currently preferred embodiment, the frame buffer described above is organized into 48 arrays of 256×1024 bits (by convention) each. These arrays are grouped as four groups of 12 arrays each. Each group has its own 128-bit wide drivers 801, I/O sense amplifiers 802, and 128 pairs of gio, gio_b signals which traverse the arrays in a direction parallel to the bit lines. This design allows for a wordline within an array to be booted and begin access to its row of memory cells independently of any data transfers which may be occurring along the gio, gio_b lines to or from the other arrays. Each of the 48 memory arrays comprising the frame buffer operate almost as independent memories connected via the common FBdata bus. However, since neighboring arrays also share a set of 512 sense amplifiers, two neighboring arrays are not permitted to simultaneously have open rows. Accordingly, up to half the arrays may have open rows at any given time. In another embodiment, the full complement of sense amplifiers may be implemented to grant access to any of the arrays at any given time so that all of the arrays may simultaneously have open rows. Each row is comprised of 1024 bits. Hence, there are 24 kbits available for column access. Both read and write operations can be initiated at a 100 MHz rate, and the memory bandwidth is 1.6 Gbytes/sec. There is no write latency, but read data is loaded into the target register on the second clock edge following the read command. For writes and reads, the control logic provides 8 bits of decoded column select information to the arrays. Two of the eight column select lines may be turned on during a write in order to write the same data to two different locations. This aspect of the invention effectively doubles the write bandwidth. This block write operation is useful for very fast background painting of the display.

Figure 9:
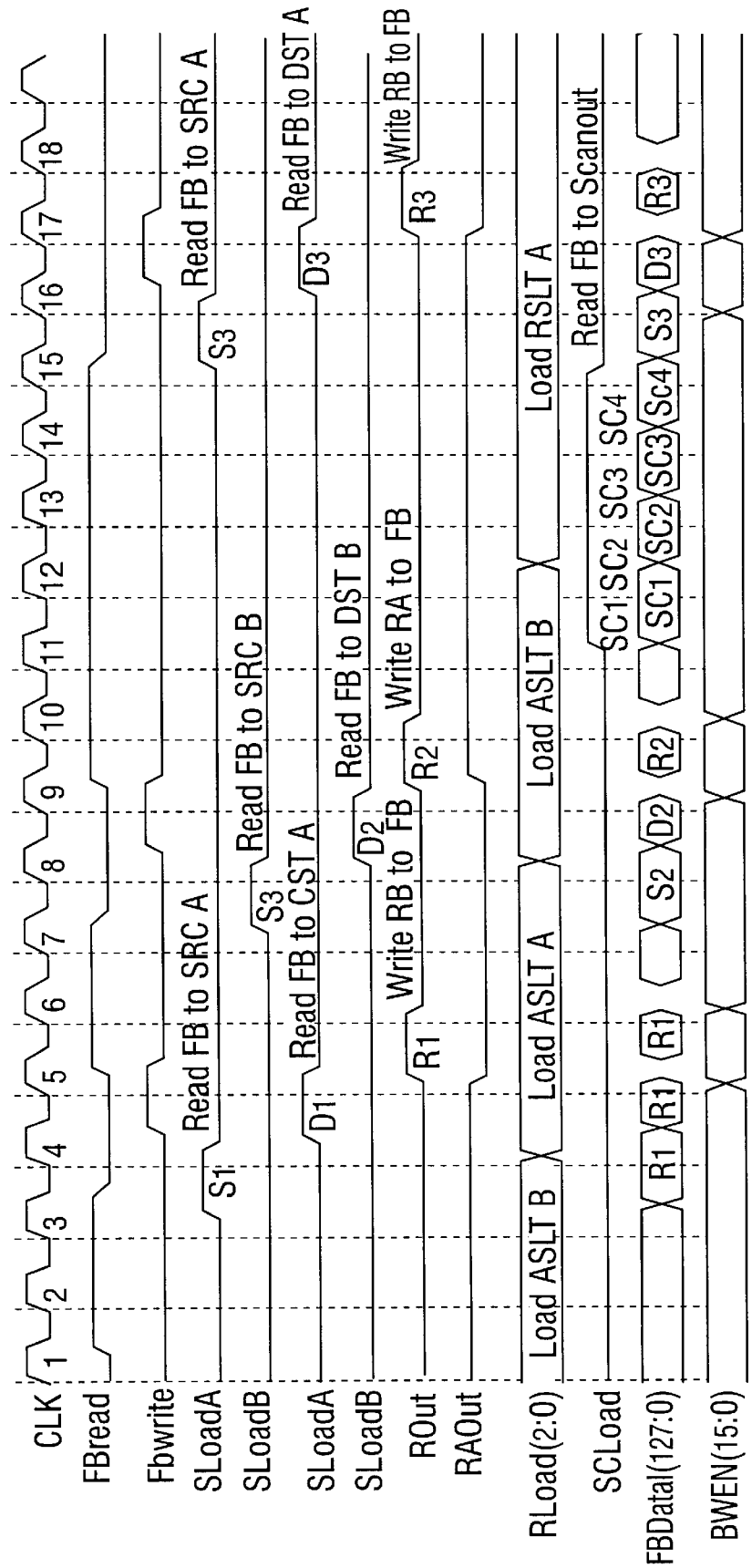
FIG. 9 shows the frame buffer read/write and registers load timing diagram.

FIG. 9 shows an exemplary frame buffer read/write and registers load timing diagram. RAP registers, SRC/DST, and Scanout registers load data from FB DRAM while Result register writes data back to the FB DRAM together with byte write enable signal BWEN. The controller uses sequencers to route data in and out of FB DRAM for different operations. The example above shows a high sustained memory bandwidth utilization only if page open look-ahead mechanism exists.

Figure 10:
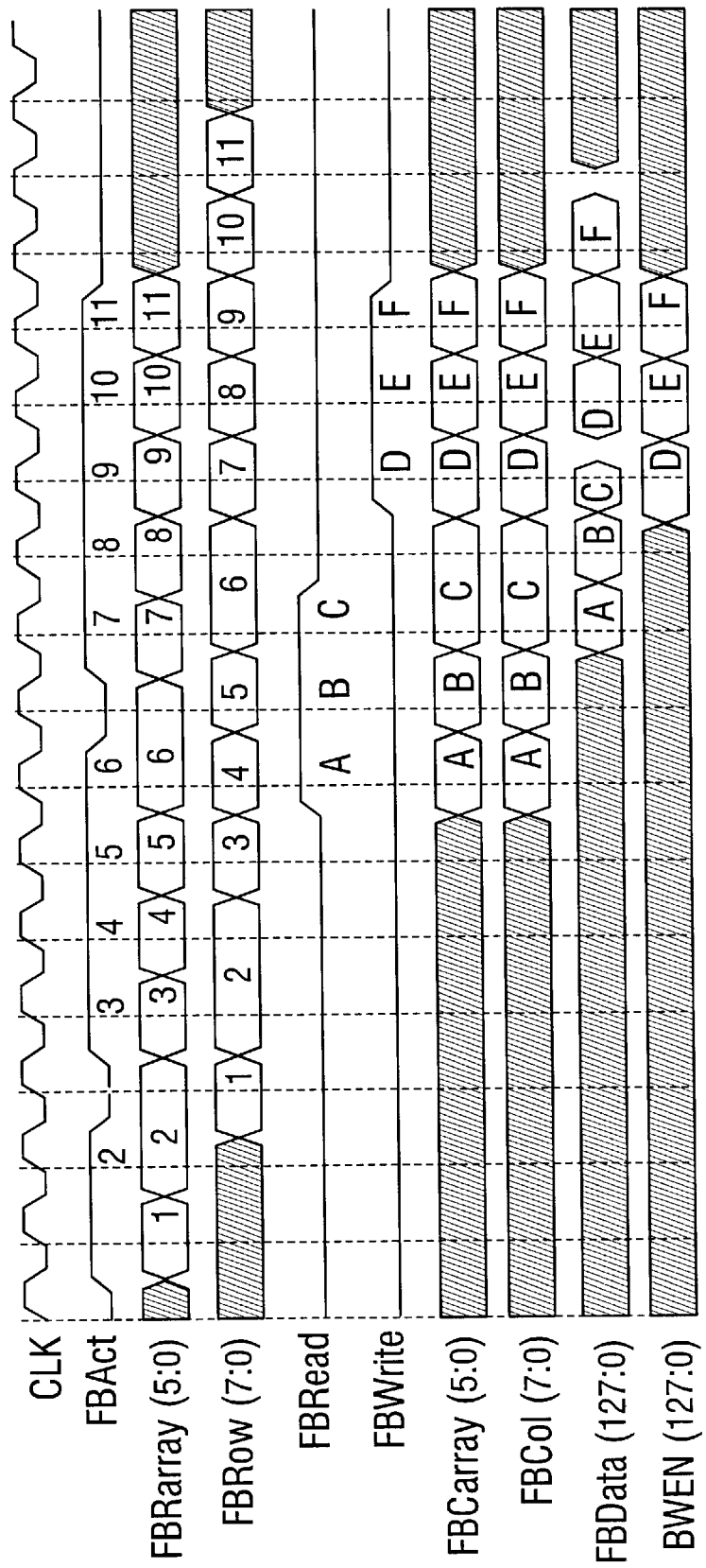
FIG. 10 shows the frame buffer DRAM access timing diagram.

FIG. 10 shows an exemplary frame buffer DRAM access timing diagram. Addresses, FBArray, and FBRow, that associates with FBAct command are used for page open. Page open can happen at burst rate (i.e., every clock). Addresses, FBCarray and FBCol, that associates with FBRead or FBWrite command are used for FBDRAM read/write access. Read or write can also happen at burst rate. Byte write enable, BWEN, comes with FBWritew command to control which bytes actually updates DRAM contents. Note that Activate and read/write can happen in parallel.

Figure 11:
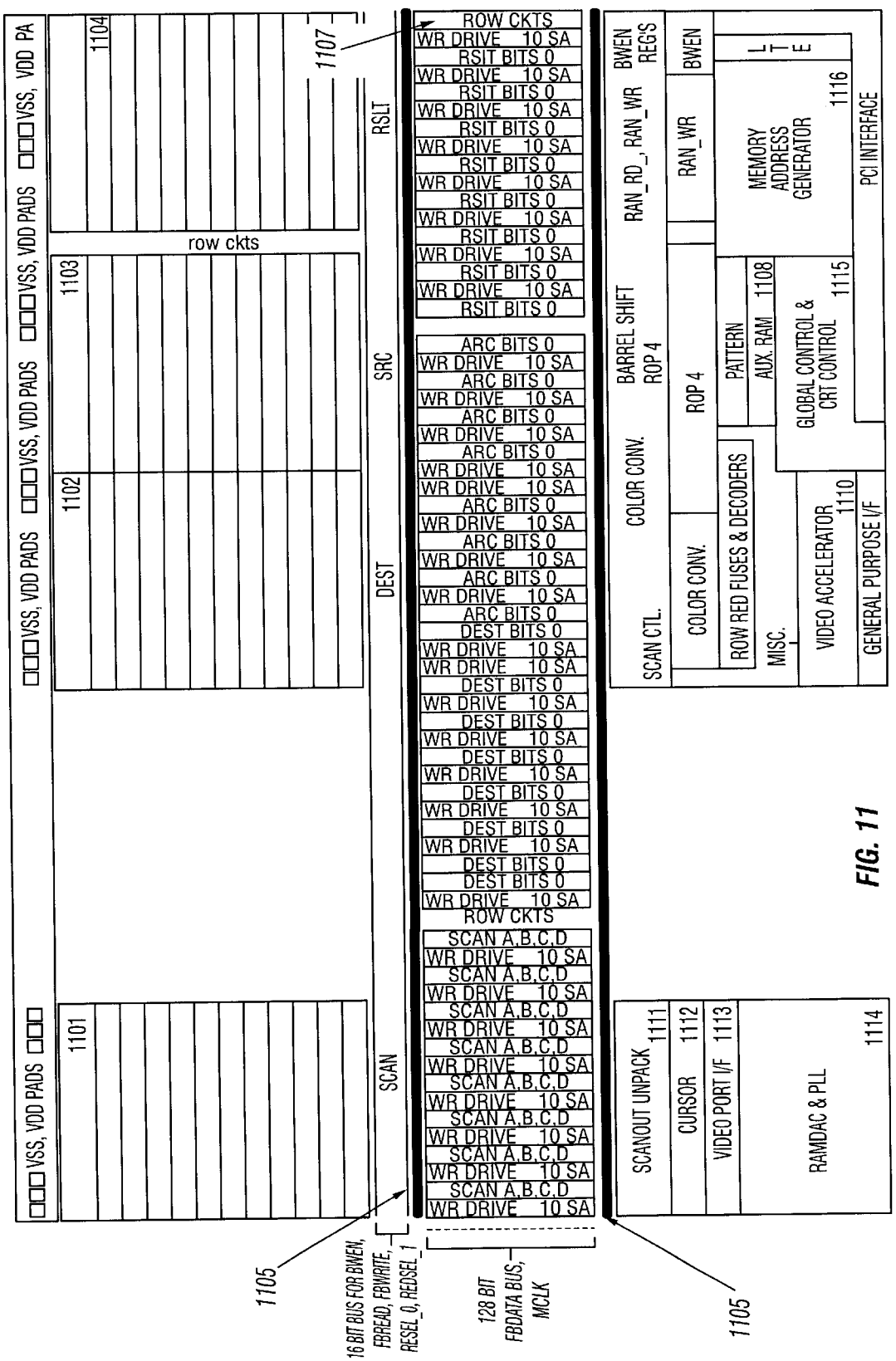
FIG. 11 shows a detailed block diagram of one possible physical layout of the chip upon which the invention may be practiced.

FIG. 11 shows a detailed block diagram of one possible physical layout of the chip upon which the invention may be practiced. FIG. 11 corresponds to the circuit diagram shown in FIG. 3. The four groups of 256×1024 frame buffer DRAM arrays are shown as 1101–1104. These arrays 1101–1104 are tightly coupled to the SCAN, DEBT, SRC, and RSLT registers. A 128-bit FBdata bus and 16 bit BWEN bus 1105 are used to route the data through the chip. A clock 1106 is fed to the various chip components. Associated row circuitry is shown as 1107. The auxiliary RAM is shown as 1108. Other blocks of interest include the ROP4 engine 1109, video accelerator 1110, scanout unpack 1111, cursor hardware 1112, video port 1113, RAMDAC 1114, global controller 1115, and memory address generator 1116.

SCOREBOARD CIRCUIT OF INVENTION

Figure 12:
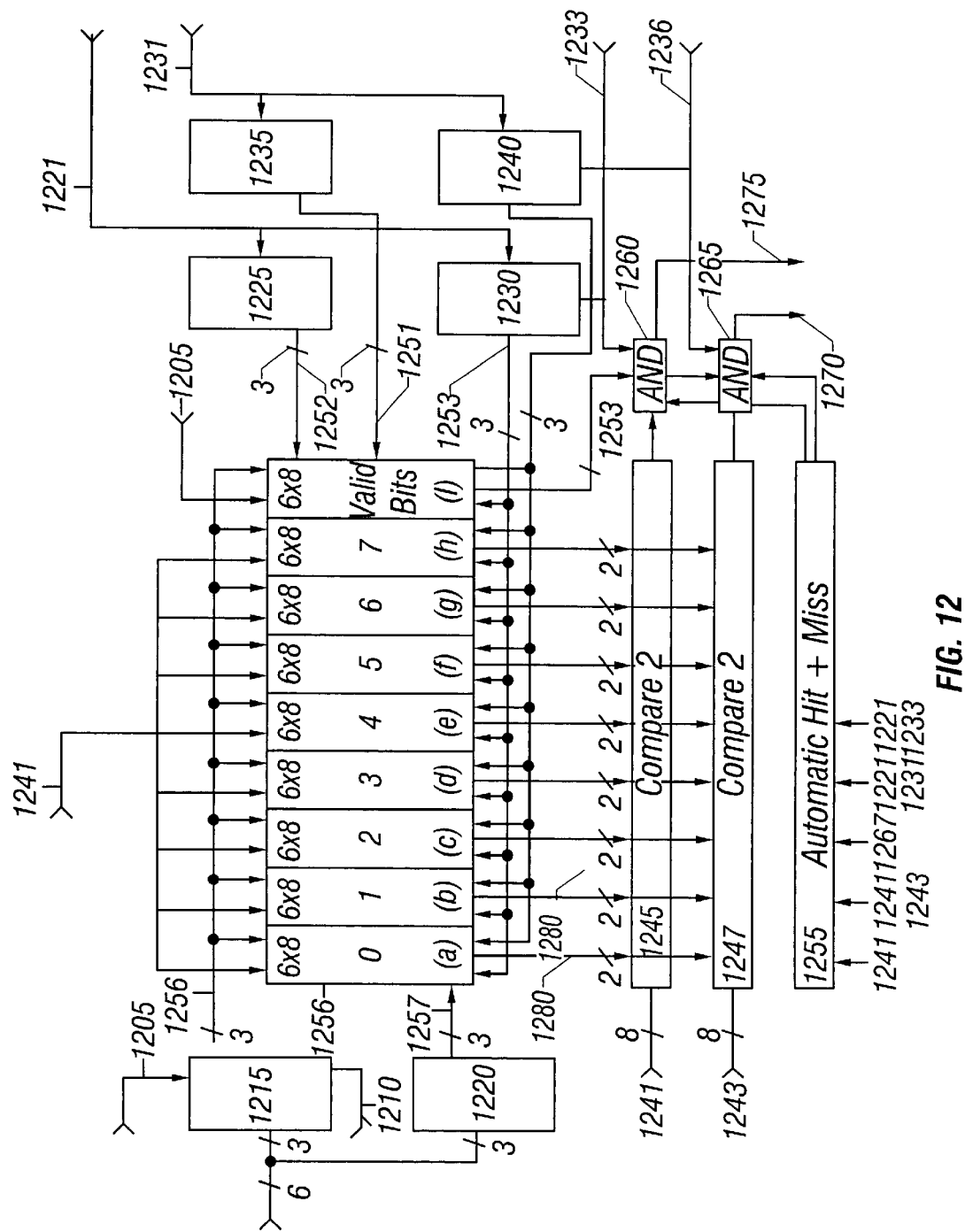
FIG. 12 is a circuit schematic of the scoreboarding circuit of the invention for allowing dual array simultaneous memory access within the DRAM of the invention.

FIG. 12 illustrates a circuit schematic of the scoreboarding circuit 1200 of the invention. As discussed above, the frame buffer DRAM 304 circuit (FB DRAM) of the invention contains a number of memory arrays (e.g., 48 in one embodiment) and each array contains a number of rows or "pages" (e.g., 256 in one embodiment). Each row contains a number of columns (e.g., 8 in one embodiment) and each column contains 128 bits or 16 bytes. Therefore, each row contains 1024 bits in one embodiment.

Within the invention FB DRAM 304 two memory accesses (MAOs) can take place simultaneously for any given clock cycle. A first memory access allows a read or write to occur in any pre-opened row of any memory array. The second memory access allows any row of any non-conflicting array to be opened for later use. In this fashion, rows can be opened in advance of their use and, further, the row opening can take place simultaneously with another non-conflicting memory read/write operation. In a particular embodiment of the invention, neighboring arrays share the same row sense amplifiers used to open their row. In this particular embodiment, neighboring arrays that share the row sense amplifiers are conflicting arrays since only one row between them can be open at any time. However, in other embodiments of the invention where each array is given its own set of row sense amplifiers, this limitation is removed and conflicting arrays reduce to identical arrays in that no two rows of the same array can be open at the same time.

Simultaneous dual memory accesses within the invention rely on memory rows being accessed (e.g., by a read/write memory access) that (1) were previously opened by a prior memory access operation and (2) that remain open just before the read/write memory access. To facilitate this operation, the scoreboard circuit 1200 of FIG. 12 maintains a history of which rows are currently open at any time within the FB DRAM 304 of the invention. As described below, circuit 1200 maintains this information using a sectioned memory circuit 1250.

Circuit 1200 of FIG. 12 contains a memory circuit 1250 that is divided into eight different memory sections, denoted as (a) through (h), corresponding to bit 0 to bit 7, respectively, of an 8-bit row address. Each memory section contains 48 single bit entries, or one for each array within the FB DRAM 304.

FIG. 13A shows the logical mapping 1300 of a particular memory section, e.g., any of 1250(a) through 1250(h). The single bit entries are addressed according to a three bit address along the horizontal 1320 which selects between positions 0, 1, 2, 3, 4, or 5 in the "x" dimension. Along the "y" direction, the memory sections are addressed along the vertical 1325 by a three bit address which selects between positions 0, 1, 2, 3, 4, 5, 6, or 7. According to this mapping 1300, the single bit entry positions are shown in FIG. 13A for arrays 0 to 47 of the FB DRAM 304 of the invention. An exemplary single bit entry 1310 for array 23 is specifically labeled. Each memory section of 1250(a) through 1250(h) is similarly mapped. Therefore, by accessing a particular single bit memory position (e.g., 1310) for each of the memory sections, 1250(a) through 1250(h), the memory 1250 of the invention scoreboarding circuit 1200 outputs an eight bit value representing a row number. The row number is associated with the particular array accessed, e.g., array 23 in this example. During write update cycles, eight bit row information is analogously stored in the addressed array location (and corresponding valid bit set, see below) to indicate that the row is open.

Since there are only eight memory sections, the largest number of unique rows that can be stored in any particular array is 256, which is also the number of rows per array in the FB DRAM 304. Therefore, an additional memory section 1250(i) (FIG. 12) is also provided to act as a valid bit for each array. The memory mapping of 1250(i) is analogous to the memory mapping 1300 of FIG. 13A. The single bit value stored in memory section 1250(i), for a particular array, indicates whether or not any row in that array contains an open row. If the valid bit is "1" for a particular array, then the row number in the memory sections 1250(*a*) through 1250(*h*), corresponding to the particular array, indicates a valid and open row. If the valid bit is "0" for a particular array, then the row number in the memory sections 1250(*a*) through 1250(*h*), corresponding to the particular array, is invalid and no row in the particular array is open despite the stored row number.

It is appreciated that the memory 1250 of circuit 1200 contains one write port and two read ports, in one embodiment. If a write and a read to the same location occur simultaneously, the newly written data is passed to the read port(s). The read control can simultaneously access the same or different registers for readout on each of the two read ports.

According to FIG. 12, two six bit read address array (RAA) values are input to circuit 1200. A first RAA address is received over bus 1221 and corresponds to a first memory access operation (MAO). The three LSBs of bus 1221 are latched by circuit 1225 and output over three bit bus 1252. The three MSBs of bus 1221 are latched by circuit 1230 and output over three bit bus 1253. Bus 1252 and bus 1253 are coupled to address each memory section 1250(*a*)–1250(*i*). Using a first read port, bus 1252 addresses the 8 vertical positions of mapping 1300 of each memory section 1250(*a*) through 1250(*i*). Using the first read port, bus 1253 addresses the 6 horizontal positions of mapping 1300 of each memory section 1250(*a*) through 1250(*i*). A second RAA address is received over bus 1231 and corresponds to a second MAO. The first and the second RAA are received simultaneously. The three LSBs of bus 1231 are latched by circuit 1235 and output over three bit bus 1251. The three MSBs of bus 1231 are latched by circuit 1240 and output over three bit bus 1254. Bus 1251 and bus 1254 are coupled to address each memory section 1250(*a*)–1250(*i*). Using a second read port, bus 1251 addresses the 8 vertical positions of mapping 1300 of each memory section 1250(*a*) through 1250(*i*). Using the second read port, bus 1254 addresses the 6 horizontal positions of mapping 1300 of each memory section 1250(*a*) through 1250(*i*).

The eight bit row data accessed by the first read port is transferred over a first bit of each of the 2-bit buses 1280–1287 from memory 1250. These lines are coupled to a first comparator circuit 1245. The corresponding valid bit of the first read port is transferred over a first bit of 2-bit bus 1288 to AND gate 1260. The eight bit row data accessed by the second read port is transferred over a second bit of each of the 2-bit buses 1280–1287. These lines are coupled to a second comparator circuit 1247. The corresponding valid bit of the second read port is transferred over a second bit of 2-bit bus 1288 to AND gate 1265.

An eight bit row value of FIG. 12 corresponding to the first MAO is received over 8-bit bus 1241 (and coupled to comparator 1245) and an eight bit row value corresponding to the second MAO is received over 8-bit bus 1243 (and coupled to comparator 1250 ). These row values are received simultaneously with the two RAA values described above. If the row value over bus 1241 matches the row value over the first bit of the 2-bit buses 1280–1287, then comparator 1245 asserts a match signal received by AND gate 1260. If the row value over bus 1243 matches the row value over the second bit of the 2-bit buses 1280–1287, then comparator 1250 asserts a match signal received by AND gate 1265. The AND gate 1260 also receives a scoreboard ready signal (SB read1) over line 1233. The AND gate 1265 also receives a scoreboard read2 signal (SB read2) over line 1236. Lines 1233 and 1236 are also coupled to synchronize circuits 1230 and 1240, respectively. SB read1 indicates that a valid first MAO is received and SB read2 indicates that a valid second MAO is received.

When the match signal from comparator 1245 is asserted, the SB read1 signal is asserted, and the first bit of bus 1288 indicates a valid row number, a hit1 signal over line 1275 is asserted. When the match signal from comparator 1250 is asserted, SB read2 signal is asserted, and the second bit of bus 1288 indicates a valid row number, a hit2 signal over line 1270 is asserted. Hit1 signal corresponds to the first MAO and hit2 signal corresponds to the second MAO. Hit1 and hit2 are simultaneously generated.

During a write update cycle, a 6-bit write array address (WAA) is received over bus 1267. The three MSBs of bus 1267 are latched into circuit 1215 and asserted over 3-bit bus 1256 which is coupled to address each memory section 1250(*a*)–1250(*i*). These address the six horizontal positions of mapping 1320. The three LSBs of bus 1267 are latched into circuit 1220 and asserted over 3-bit bus 1257 which is coupled to address each memory section 1250(*a*)–1250(*i*). These address the eight vertical positions of mapping 1325. Also, the eight bit row value associated with the write update cycle is received over 8-bit bus 1241, the bits of bus 1241 coupled to the memory sections 1250(*a*)-1250(*h*) with the LSB to section 1250(*a*) and the MSB coupled to 1250(*h*). A valid bit signal received over 1205 acts to set (or reset) the valid bit addressed by buses 1256 and 1257 for this row. Line 1205 is also coupled to circuit 1215. A scoreboard write (SIB write) signal is also received over line 1210 and synchronizes the write update cycle.

Constraint Resolution. Constraint resolution is an extension of the scoreboarding circuit 1200 where particular implementation constraints are processed in parallel. In effect, it can be considered to utilize multiple scoreboards that are tracking the memory access status all the time. Examples of implementation constraints are presented below. First, a constraint that does not allow activate (e.g., open) a page and read/write to that page at the same time. It requires a detection of both scoreboard read port addresses referring to the same array. If it does happen, arbitration based on access priority grants one read port and denies the other in this embodiment. This monitoring process, conflict resolution, occurs at the same cycle so that scoreboard checking results are available and valid for every clock, thus allowing operation to execute every clock cycle. Second, a constraint to save power requires more than one clock to open a page before it can read or write, in one implementation. Therefore, the status of scoreboard checking of a valid entry distinguishes if a page is opening or opened. Only if the page is opened, in this embodiment, is a read/write operation allowed. If the page is opening, then read/write operations have to be postponed until the page is opened, in this embodiment. There can be other constraints due to other power considerations, especially when power consumption issues affect DRAM sense amplifier design.

In alternative embodiments of the invention, the scoreboard circuitry can be used to monitor the following seven constraints: (1) activate to read/write latency (opening vs. opened); (2) activate an array to activate the same array or adjacent arrays latency (artifact of sense amplifier power consumption constraint and sharing constraints); (3) read to write transition latency (artifact of power constraint); (4) write to activate the same/adjacent array (artifact of power constraints); (5) activate and read/write to same array (artifact of logic conflict); (6) activate or read/write to a pending array or its neighbors, see (1); and (7) allow out of order read but do not allow out of order write execution (artifact of logic constraints). It is appreciated that aside from (5) and (7) above, these constraints can be technology driven. For example, if there is no sense amplifier sharing between arrays in DRAM 304, or power is not an issue, then these other constraints are removed.

Figure 13B:
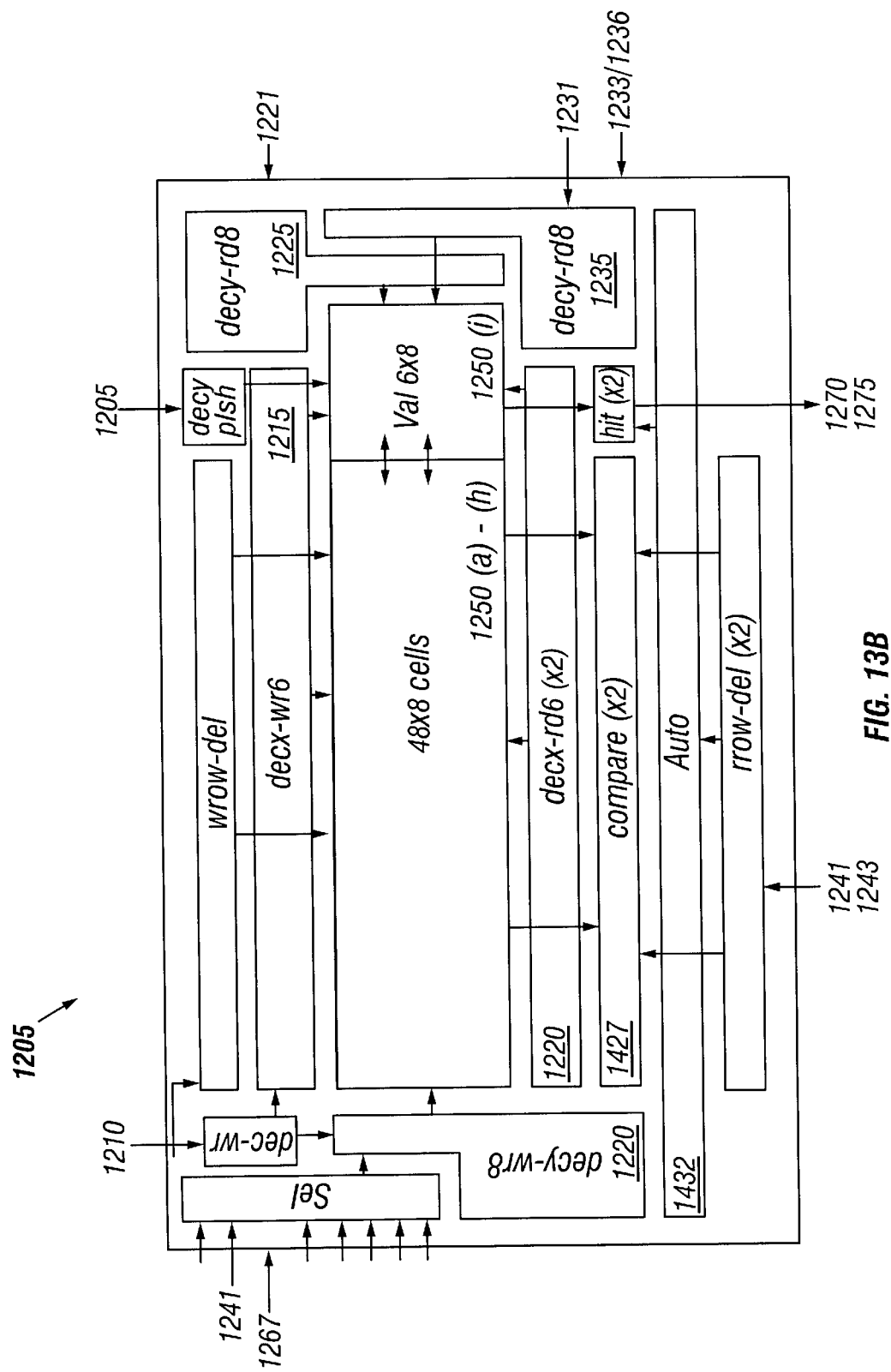
FIG. 13B is an exemplary circuit block layout of one implementation of the scoreboarding circuit of the invention.

FIG. 13B is an exemplary circuit layout of elements of the scoreboard circuit 1200 of the invention. It is appreciated that the invention is well suited to operate within alternative layout configurations and that the particular configuration of FIG. 13B is only one implementation. The memory sections 1250(a)–1250(h) and memory section 1250(i) are shown in the center. To the right are located RAA latch circuits 1225 and 1235. RAA latch circuits 1230 and 1240 are located central and to bottom of FIG. 13B. Comparator circuits 1245 and 1247 are located within region 1427. Write array address latch circuits 1210 and 1215 are located toward the left and toward the top central, respectively. Also shown on FIG. 13B are the respective input and output lines including the first and second MAO RAA lines 1221 and 1231, respectively, to the right. The SB read1 1233 and SB read2 1236 lines are also shown to the right. The write array address line 1267 and the write data line 1241 are shown to the left. The first and second row data lines for the first and second MAOs are shown as 1241 and 1243, respectively, to the bottom. The hit1 and hit2 signals are also shown to the bottom as lines 1275 and 1270.

Figure 14A:
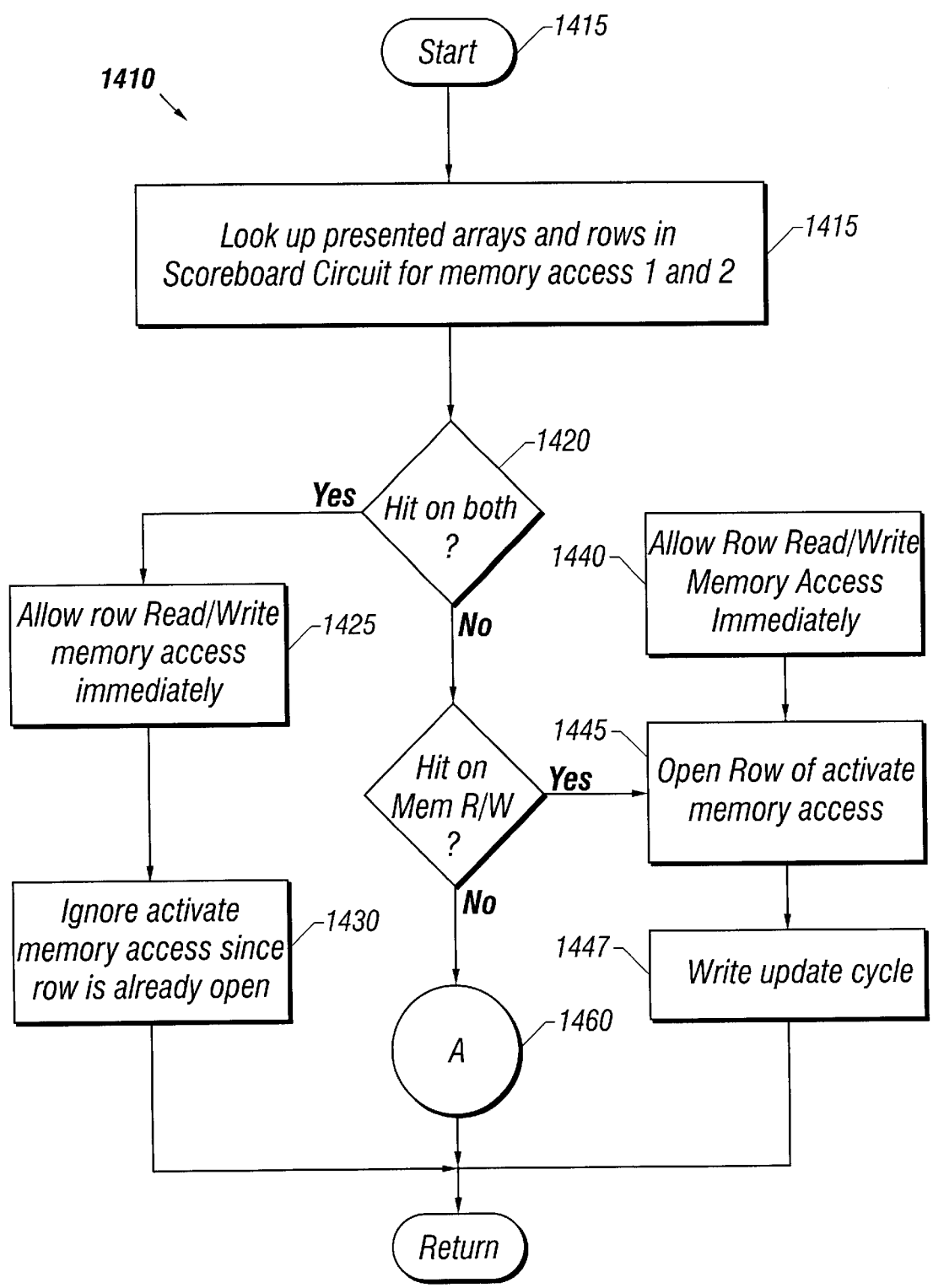
FIG. 14A and FIG. 14B illustrate a flow diagram of steps of the invention for performing DRAM scoreboarding.
Figure 14B:
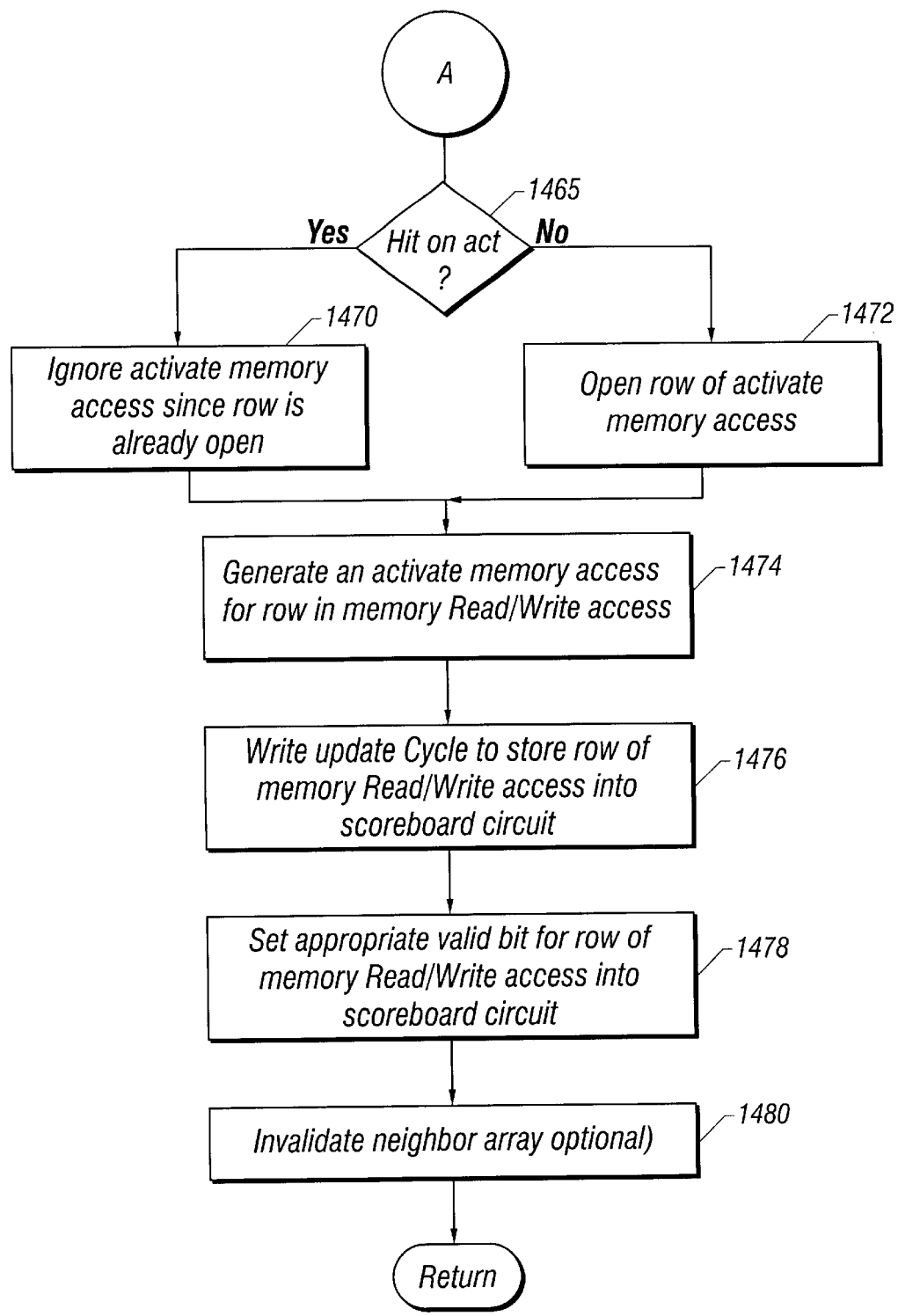

FIG. 14A and FIG. 14B illustrate a process 1410 of the operation of an embodiment of the scoreboard circuit 1200 of the invention. It is appreciated that in an alternative embodiment, some of the steps discussed below can be replaced or their position altered without departing from the spirit or scope of the invention. Process 1410 commences with step 1415 of FIG. 14A where circuit 1200 receives a first and second RAA (e.g., over buses 1221 and 1231) and a first and second row data (e.g., over buses 1241 and 1243). According to the invention, both a read/write memory access and a row open (e.g., activate) memory access can be received simultaneously at step 1415. The scoreboard circuit 1200 is used to determine if the received rows of the RAAs are currently open so that the MAOs can proceed immediately, or if they need to be delayed. At step 1415, circuit 1200 looks up the corresponding row information from memory 1250, including the corresponding valid bits for the first and second RAAs. The data output from memory 1250 is then compared to the row data on bus 1241 and bus 1243 by comparator circuits 1245 and 1250. The valid bits are then checked by AND circuits 1260 and 1265 and hit determinations are made.

At step 1420 of FIG. 14A, if both hit1 1275 and hit2 1270 are asserted, then both presented rows matched and were valid. In this case, both of the rows associated with the first and second MAO are open. At step 1425, the read/write memory access is allowed to occur immediately thereafter. Further, at step 1430, the activate memory access is ignored since the row that it intended to open was determined by scoreboard circuit 1200 to be already open. In this case, process 1410 then returns to process another pair of MAOs.

At step 1420, if both hit1 1275 and hit2 1270 are not asserted, then step 1450 is entered. At step 1450, it is determined if there was a hit associated with the memory read/write access. If so, then the miss was due to the corresponding activate memory access (if present). At step 1440, the read/write memory access is allowed to occur immediately thereafter. At step 1445, memory access cycles are generated so that the requested row of the activate memory access operation can be opened within FB DRAM 304. A data bus is not required for this operation. The row open function can take as much as 6 clock cycles to perform. At step 1447, once the specified row is open, a write update cycle occurs where the row number is forwarded over bus 1241 and the specified array is forwarded over bus 1267. The row information is then stored in memory 1250 in the specified array number and the corresponding valid bit is set. In one implementation of the invention where two or more neighboring arrays share the same sense amplifiers, the rows of the neighboring arrays are also marked as invalid within memory 1250(i) at step 1447. Process 1410 then returns to process another pair of MAOs.

At step 1450, if the hit was not associated with the read/write memory access operation, then 1465 of FIG. 14B is entered. At step 1465 circuit 1200 determines if there was a hit on the activate memory access operation. If so, then there was (1) a miss on the read/write memory access operation but (2) a hit on the activate memory access operation. In this case, the activate memory access operation is ignored, since its corresponding row is already open, and process flows to step 1474.

At step 1465 of FIG. 14B, if there was not a hit on the activate memory access operation then there was (1) a miss on the read/write memory access operation and (2) a miss on the activate memory access operation. In this case, at step 1472, memory access cycles are generated to open the row corresponding to the activate memory access operation and a write update cycle is generated similar to step 1447 (FIG. 14A). Step 1474 is then entered.

Step 1474 of FIG. 14B is entered so that the row needed by the read/write memory access operation can be opened. At step 1474, a new activate memory access operation is generated specifying the array and row values associated with the missed read/write memory access operation. At step 1476, after the new activate memory access operation completes, a write update cycle is performed to store the information regarding the newly opened row into the memory 1250 of the scoreboard circuit 1200. At step 1478, the appropriate valid bit is set for the newly opened row in memory 1250(i). In one implementation of the invention where two or more neighboring arrays share the same sense amplifiers, the rows of the neighboring arrays are also marked as invalid within memory 1250(i) at step 1480. Process 1410 then returns to process another pair of MAOs.

In the operation above, scoreboard circuit 1200 guarantees that a row is open before it allows access by a MAO. In the event of a miss on a read/write operation, the row is opened and the read/write operation is delayed. As discussed below, a particular "tile" memory mapping configuration is utilized in order to provide efficient memory look ahead prediction so that a row can effectively be opened before it is needed. In this case, the scoreboard circuit 1200 of the invention acts as a safeguard in the minority of cases where the prediction logic was not able to open a needed row in advance.

TILE MEMORY MAPPING OF THE INVENTION

As described above, the scoreboard circuit 1200 of the invention allows a mechanism and system for determining which rows of which arrays are currently open so that rows can be pre-opened before they are needed. Additionally, the FB DRAM 304 of the invention contains memory arrays which each contain rows. However, within this configuration, at most one row of sense amplifiers is provided to open one row of any array at any time. In an alternative embodiment, neighboring arrays share the row of sense amplifiers between their respective rows. Only one row of any neighboring arrays can be open at any time in the alternative configuration. Therefore, while the scoreboard circuit 1200 facilitates the pre-opening of rows, rows within (1) the same array or, alternatively, (2) within neighboring conflicting arrays cannot be open at the same time. For instance, if a graphics device is currently accessing data from row 1 of array 1 and it predicts that row 3 of array 1 is needed next, the FB DRAM 304 of the invention does not pre-open row 3 because row 1 is already open and their arrays (e.g., array 1) conflict due to the single row of sense amplifiers allocated for array 1.

In order to reduce the opportunity of row conflicts as described above, the invention utilizes an advantageous "tile" memory mapping configuration. This configuration divides the FB DRAM 304 memory in a manner which reduces row conflicts and therefore increases the opportunity to pre-open rows before they are needed. As a result, memory access throughput is drastically increased.

Figures 15, 16A, 16B:
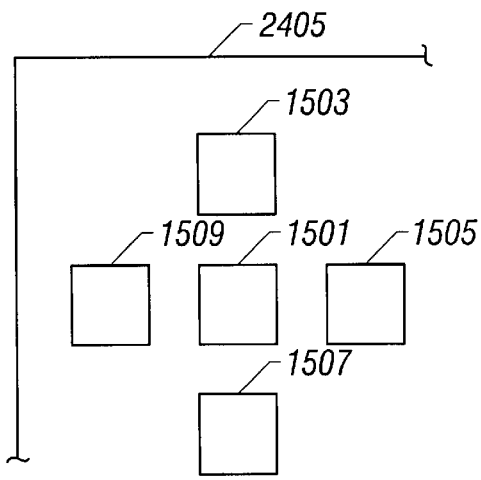
FIG. 15 is an illustration of a central pixel and four surrounding pixels within the invention memory mapping configuration.
FIG. 16A is an illustration of a memory configuration utilized by an embodiment of the invention for computer system graphic display modes utilizing 640 (horizontal)× 480 (vertical)×8 bits per pixel using 5 arrays per scan line.
FIG. 16B is an illustration of a memory configuration utilized by an embodiment of the invention for computer system graphic display modes utilizing 640 (horizontal)× 480 (vertical)×16 bits per pixel using 10 arrays per scan line.

As shown in FIG. 15, the memory mapping configuration of the invention translates the memory mapped for the screen (e.g., display 2405 of FIG. 24) into "tiles" within the FB DRAM 304 such that for any given pixel ("central pixel") 1501 stored in row y of array x of the FB DRAM 304, the pixel 1503 located directly above the central pixel 1501, the pixel 1507 directly below the central pixel 1501, the pixel 1505 located directly to the right of the central pixel 1501, and the pixel 1509 located directly to the left of the central pixel 1501 are all guaranteed to be stored (1) in the same row, y, of the same array, x, of the central pixel 1501 or (2) in arrays that do not include array x, or any other conflicting array (e.g., a conflicting neighbor of array x). For instance, assume central or current pixel 1501 is in array 2, row x. In this example, pixel 1509 can be in row, x, of array 2, pixel 1505 can be in row, z, of array 4, pixel 1503 can be in row, i, of array 8, and pixel 1507 can be in row, u, of array 12. In this configuration, while the FB DRAM 304 is accessing information for the central pixel 1501, or just before, it can simultaneously pre-open any of the rows for the four neighboring pixels 1503, 1505, 1507 and 1509 without a conflict. As long as the neighboring four pixels do not share the same array (or conflicting array) as the central pixel or do not share a different row of the same array as the central pixel, then the rows associated with these pixels can be pre-opened in advance of their access without conflicting with the memory access of the central pixel 1501.

The particular configuration of neighboring pixels (e.g., up, down, right, and left) about the central pixel 1501 is particularly selected by the invention because during many graphic update operations (e.g., bit level transfers) one of the above neighboring pixels is typically processed next, after the central pixel, during display screen updating. Therefore, while the central pixel is being processed, the FB DRAM 304 of the invention can pre-open the expected next pixel (e.g., one of the neighboring four pixels) without a memory conflict.

In a tiled mapped memory architecture, there are different mechanisms possible such that page pre-opening and memory array conflicts can be managed. However, in a memory management system whose controller is not closely coupled with the DRAM, it is not usually known to the controller design about external memory internal structure and address decoding among memory arrays for a commercially available memory. Furthermore, these internal structures can vary among different types of DRAM, like EDO, RDRAM, etc., or among different capacities (e.g., 4 Mb, 16 Mb, etc.), or among different pin-outs (e.g., x4, x16, etc.) or among different manufacturers. It is very difficult for a standalone controller to implement a tile memory translation that can really benefit from mapping since page pre-open and array conflicts cannot be analyzed. However, within the invention, a close coupling exists between the DRAM 304 and the controller circuitry. In this case, only a close coupled DRAM whose physical addresses (array, row, column) are exposed to the on-chip controller can really take advantage of tile memory architecture. In addition, this linear to physical translation can be tuned for different display resolutions or color depth (see below). In certain implementations, there are two different translations due to a trade-off between performance optimization and simplicity of translation logic.

The invention memory mapping method involves a translation between a received linear address (representing a screen pixel location and color) to a physical address stored in the arrays within the FB DRAM 304. This translation takes place within a computer system (FIG. 24) and is processed before any data is stored in the FB DRAM 304 (FIG. 25). Before the translation, screen pixels are mapped in linear address space in sequential linear addresses and these linear addresses can be referenced, generally, from a known x and y screen location of the pixel. This (x, y) reference is well known in the art. Based on any sequential linear address mapping, the invention utilizes the translation mechanism of Table I to convert from linear addresses to physical addresses for screen display modes having x (horizontal) dimensions of 640, 800, and 1280 pixels. Once the linear addresses are translated to physical addresses, the invention writes and reads the pixel information into the FB DRAM 304 of the invention using the physical addresses.

TABLE I

| 20 18 17 | | 10 9 | 7 6 | 4 3 | 0 |
|---|---|---|---|---|---|
| A | B | C | D | E | |

Where:
A = Array Type Field (3 bits)
B = Page Number (8 bits)
C = Array Value (3 bits)
D = Column (3 bits)
E = Byte Number (4 bits)

Table I represents a received linear address having 21 bits. The first four bits, field E, define a particular byte storage. Since the granularity of a memory access within the invention is 128 bits, the lower four bits of the received linear address are ignored during the translation. The next 3 bits, field D, directly define the particular column for storage within the FB DRAM 304 of the invention. The next 3 bits, field C, are used to define the array value (defined below) of the particular array for storage within the FB DRAM 304. The next 8 bits, field B, directly define the row or "page" used to store within the FB DRAM 304. Lastly, the next three bits, field A, define the array type field. Together the array type, field A, and the array value, field C, are used to define the array used. Using the above fields, the invention memory mapping method translates the received linear address into a physical address (including array value, row value and column) for storage into the FB DRAM 304 according to a particular mapping described below.

Table II illustrates the different arrays within each array type corresponding to fields A and C of Table 1. For instance, array type 0 contains arrays 0, 2, 4, 6, 8, 10, 12 and 14. As discussed further below, rows in arrays are filled in the mapping configuration of the invention in a particular array order which follows from their array type. Once all the rows of the arrays of one type are filled, the next array type is processed.

TABLE II

| Array type | Arrays |
|---|---|
| 0: | 0, 2, 4, 6, 8, 10, 12, 14 |
| 1: | 16, 18, 20, 22, 24, 26, 28, 30 |
| 2: | 32, 34, 36, 38, 40, 42, 44, 46 |
| 3: | 1, 3, 5, 7, 9, 11, 13, 15 |
| 4: | 17, 19, 21, 23, 25, 27, 29, 31 |
| 5: | 33, 35, 37, 39, 41, 43, 45, 47 |

Using the information of Table I and Table II, FIG. 16A illustrates an exemplary memory mapping configuration 1510 for a screen display mode having 640 pixels across the horizontal (e.g., x) and 480 pixels down the vertical (e.g., y) with each pixel containing 8 bits of data storage (bits per pixel, or bpp). Tile memory configuration 1510 is for the first eight display lines, with each tile representing a complete row of an array. There are five tiles per display line.

In this screen display mode, each display line (e.g., horizontal line of pixels) requires 640×8, or 5,120 bits of storage. As shown in FIG. 16A, the horizontal or x-axis across the entire display screen of 640 pixels is illustrated as 1520. Since each row of the FB DRAM 304 contains 1024 bits, 5 rows are required to store each horizontal line of pixels. For the first line 1530, these rows are stored in arrays 0, 2, 4, 5, and 8, respectively. Analogously, for the second display line, 5 rows are required to store the display information and they are stored in arrays 10, 12, 14, 0, and 2, respectively, for line 1531. The configuration to store the first eight display lines 1530–1537 is shown in FIG. 16A. This same array configuration 1510 is repeated 60 times to cover all lines from line 9 to line 480.

When a same array is repeated as the memory mapping is traversed from top to bottom, the row number used to store the data is updated. For instance, row storage in one array starts with row k and updates (e.g., increments) each time the same array is encountered again. For example, row k is used to store the display information of line 1530 for array 4, but array 4 is also used in line 1532. In line 1532, row k+u is used, etc. In FIG. 16A, the exemplary configuration contains 5 uses of array 4 and this configuration is repeated 60 times to cover 480 lines. Therefore, array 4 is used 256 times to fill rows 0 to 256 of array 4 and then array type 1 is selected and array 20 is then used such that rows 0 to 43 of array 20 are filled. Since the screen size demands of FIG. 16A are moderate, array types 2 and above are not needed within FB DRAM 304.

Table III illustrates that when the 256th row of a particular array is used, then the array type increments and a new set of arrays is used to continue to store the screen data. The memory mapping of FIG. 16A maintains the neighboring pixel rules defined with respect to FIG. 15.

TABLE III

| Row # | Array # | Array Type |
|---|---|---|
| 0 | 0 | 0 |
|  | 2 |  |
|  | 4 |  |
|  | 6 |  |
|  | 8 |  |
|  | 10 |  |
|  | 12 |  |
|  | 14 |  |
| 1 | 0 | 0 |
|  | 2 |  |
|  | 4 |  |

TABLE III-continued

| Row # | Array # | Array Type |
|---|---|---|
|  | 6 |  |
|  | 8 |  |
|  | 10 |  |
|  | 12 |  |
|  | 14 |  |
| *** |  |  |
| 255 | 0 | 0 |
|  | 2 |  |
|  | 4 |  |
|  | 6 |  |
|  | 8 |  |
|  | 10 |  |
|  | 12 |  |
|  | 14 |  |
| 0 | 16 | 1 |
|  | 18 |  |
|  | 20 |  |
|  | 22 |  |
|  | 24 |  |
|  | 26 |  |
|  | 28 |  |
|  | 30 |  |
| *** |  |  |

FIG. 16B illustrates an exemplary memory mapping configuration 1610 for a screen display mode having 640 pixels across the horizontal (e.g., x) and 480 pixels down the vertical (e.g., y) with each pixel containing 16 bpp. Tile memory configuration 1610 contains the first four display lines, with each tile representing a complete row of an array. There are 10 tiles per display line.

In this screen display mode, twice as much color data is stored for each pixel over the screen mode of FIG. 16A. In this screen display, each display line (e.g., horizontal line of pixels) requires 640×16 or 10,240 bits of storage. As shown in FIG. 16B, the horizontal or x-axis across the entire display screen of 640 pixels is illustrated as 1620. Since each row of the FB DRAM 304 contains 1024 bits, 10 rows are required to store each horizontal line of pixels in this display mode. In the first line 1630, the arrays used to store the 10 rows are arrays 0, 2, 4, 5, 8, 10, 12, 14, 0, and 2, respectively. In this case, the first occurrence of arrays 0 and 2 store in one row (e.g., 0) and the second occurrence store in an updated row (e.g., 1). Analogously, for the second display line 1631, the 10 rows are stored in arrays 4, 6, 8, 10, 12, 14, 0, 2, 4, and 6, respectively. In this line, the first occurrence of arrays 4 and 6 store in row 1 and the second occurrence store in row 2. The configuration 1610 to store the first four display lines 1630–1633 is repeated 120 times to cover all lines from line 5 to line 480; during the repetition, the array types change.

In an analogous fashion with respect to FIG. 16A, memory configuration 1610 updates the row value for each occurrence of a same array until all 256 rows of the array are utilized, at which time the array type value is incremented. The pattern of FIG. 16B is repeated 120 times and each array is used 5 times in the pattern; therefore, array types 0 and 1 are fully used and part of array type 2 is used to store the screen data for this display mode. Memory mapping configuration 1610 maintains the neighboring pixel rules defined with respect to FIG. 15.

Figure 17:
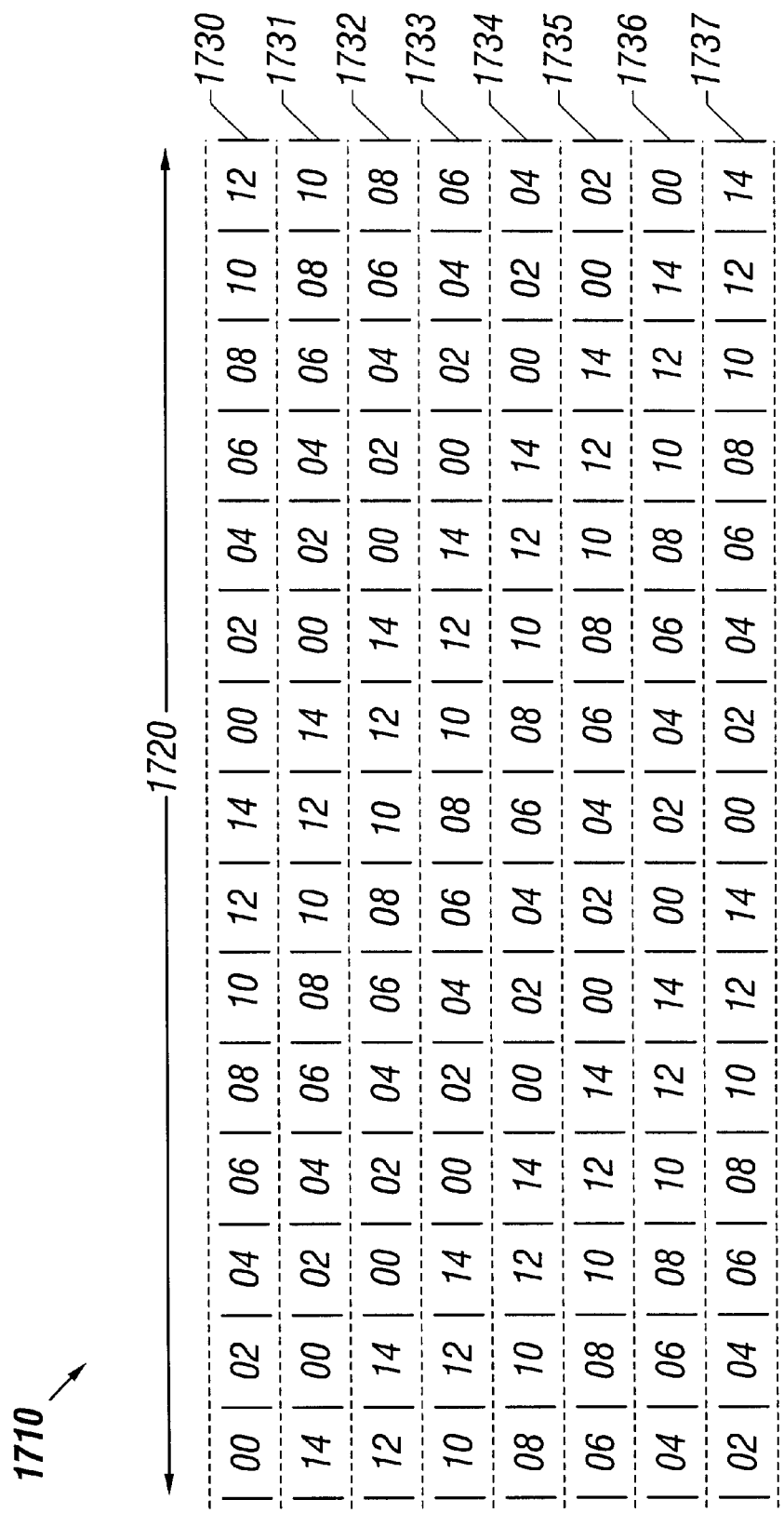
FIG. 17 is an illustration of a memory configuration utilized by an embodiment of the invention for computer system graphic display modes utilizing 640 (horizontal)× 480 (vertical)×16 bits per pixel using 15 arrays per scan line.

FIG. 17 illustrates an exemplary memory mapping configuration 1710 for a screen display mode having 640 pixels across the horizontal (e.g., x) and 480 pixels down the vertical (e.g., y) with each pixel containing 16 bpp. Tile memory configuration 1710 illustrates the first eight display lines, with each tile representing a row of an array. There are 15 tiles per display line.

In memory mapping configuration 1710, 15 arrays are used per scan line instead of 10 arrays (e.g., FIG. 16B). In this case, the 10,240 bits of storage per display row are spread out over 15 rows of 15 arrays (one row each). As shown in FIG. 17, the horizontal or x-axis across the entire display screen of 640 pixels is illustrated as 1720. In the first line 1730, the 15 rows are stored in arrays 0, 2, 4, 5, 8, 10, 12, 14, 0, 2, 4, 6, 8, 10, and 12, respectively.

Analogously, for the second display line 1731, 15 rows are required to store the display information and they are stored in arrays 14, 0, 2, 4, 6, 8, 10, 12, 14, 0, 2, 4, 6, 8, and 10, respectively. In each line, subsequent occurrences of the same array utilize updated row values. The configuration to store the first eight display lines 1730–1737 is shown in FIG. 17. This same array configuration is repeated 60 times to cover all lines from line 9 to line 480.

In an analogous fashion with respect to FIG. 16A, memory configuration 1710 updates the row value for each occurrence of a same array until all 256 rows of the array are utilized at which time the array type value is incremented. Configuration 1710 is repeated 60 times and each array is used 15 times in the configuration; therefore, array types 0, 1 and 2 are fully used and part of array type 4 is used to store the screen data for this display mode with memory configuration 1710.

Figure 18A:
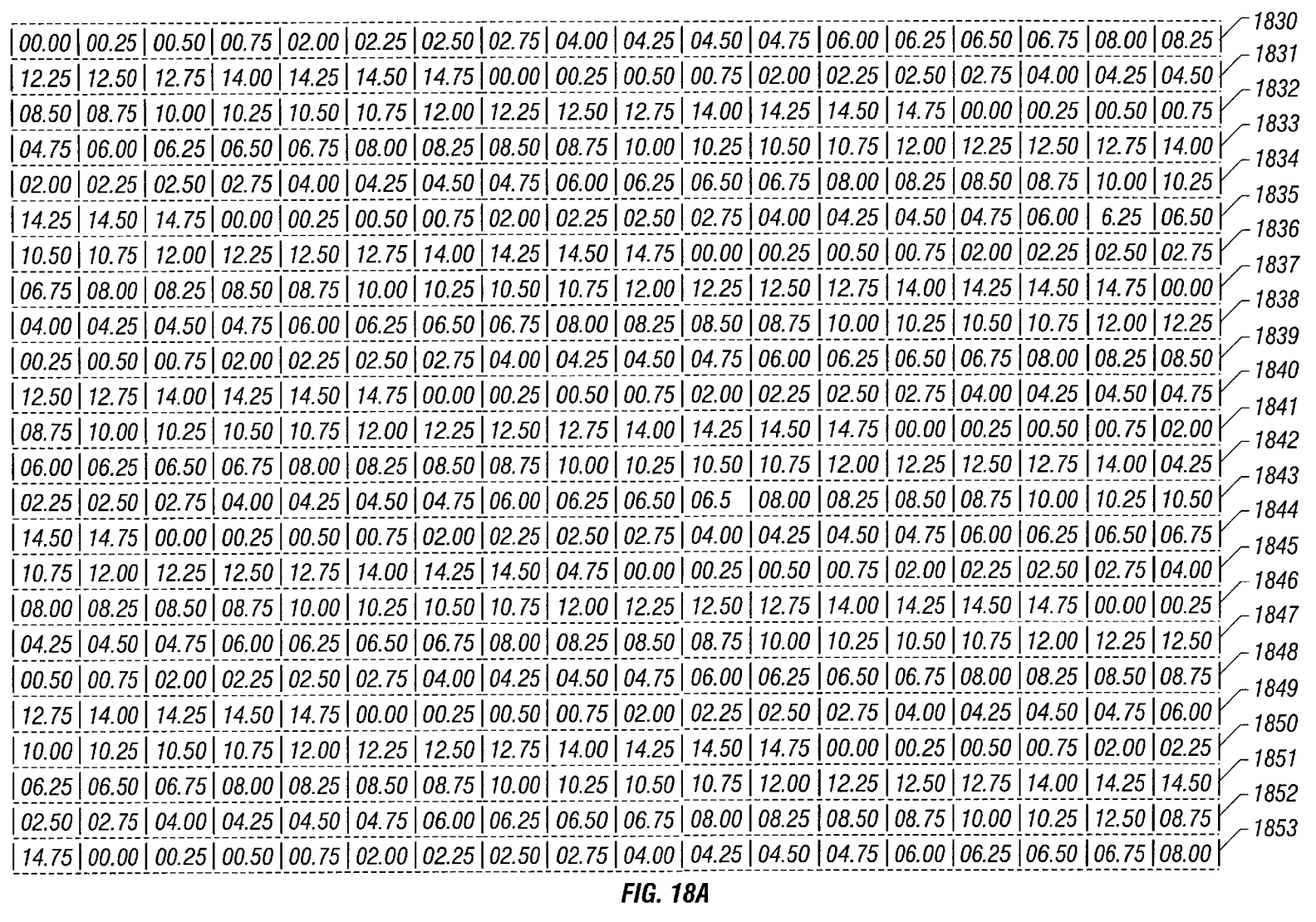

FIG. 18A and FIG. 18B illustrate the left and right portions, respectively, of exemplary memory mapping configuration 1810 for a screen display mode having 800 pixels across the horizontal (e.g., x) and 600 pixels down the vertical (e.g., y) with each pixel containing 8 bpp. FIG. 18A and FIG. 18B illustrate a tile memory configuration 1810 for the first 24 display lines, with each tile representing a quarter of a row (e.g., two columns) of an array. There are 25 one-quarter row tiles per display line. Quarter size tiles are shown because the display line storage is not divisible by 1024. Designations of partial arrays on the edge of the screen mapping indicate that only part of the row for that array is filled with pixel information for that row and the remainder of the row is filled with pixel information from the subsequent display line.

In this screen display, each display line (e.g., horizontal line of pixels) requires 800×8 or 6,400 bits of storage. As shown in FIG. 18A and FIG. 18B, the horizontal or x-axis across the entire display screen of 800 pixels is illustrated as 1820a (left side) and 1820b (right side). Since each row of the FB DRAM 304 contains 1024 bits, 6.25 rows (50 columns) are required to store each horizontal line of pixels in this display mode. In the first line 1830, the arrays that store these rows are 0, 2, 4, 5, 8, 10, and 12.25, respectively. For ease of illustration, the tiles shown are of one quarter row length. Analogously, for the second display line 1831, 6.25 rows are required to store the display information and they are from arrays 12.25, 14, 0, 2, 4, 6, and 8.25, respectively. The configuration 1810 to store the first 24 display lines 1830–1853 is shown in FIG. 18A and FIG. 18B. This same array configuration 1810 is repeated 25 times to cover all lines from line 25 to line 600; during the repetition, the array types change.

In an analogous fashion with respect to FIG. 16A, memory configuration 1810 updates the row value for each occurrence of a same array until all 256 rows of the array are utilized, at which time the array type value is incremented. The configuration 1810 is repeated 25 times and each array is used 19 times in the configuration; therefore, array type 0 is fully used and part of array type 1 is used to store the screen data for this display mode. The memory mapping 1810 maintains the neighboring pixel rules defined with respect to FIG. 15.

Figure 19:
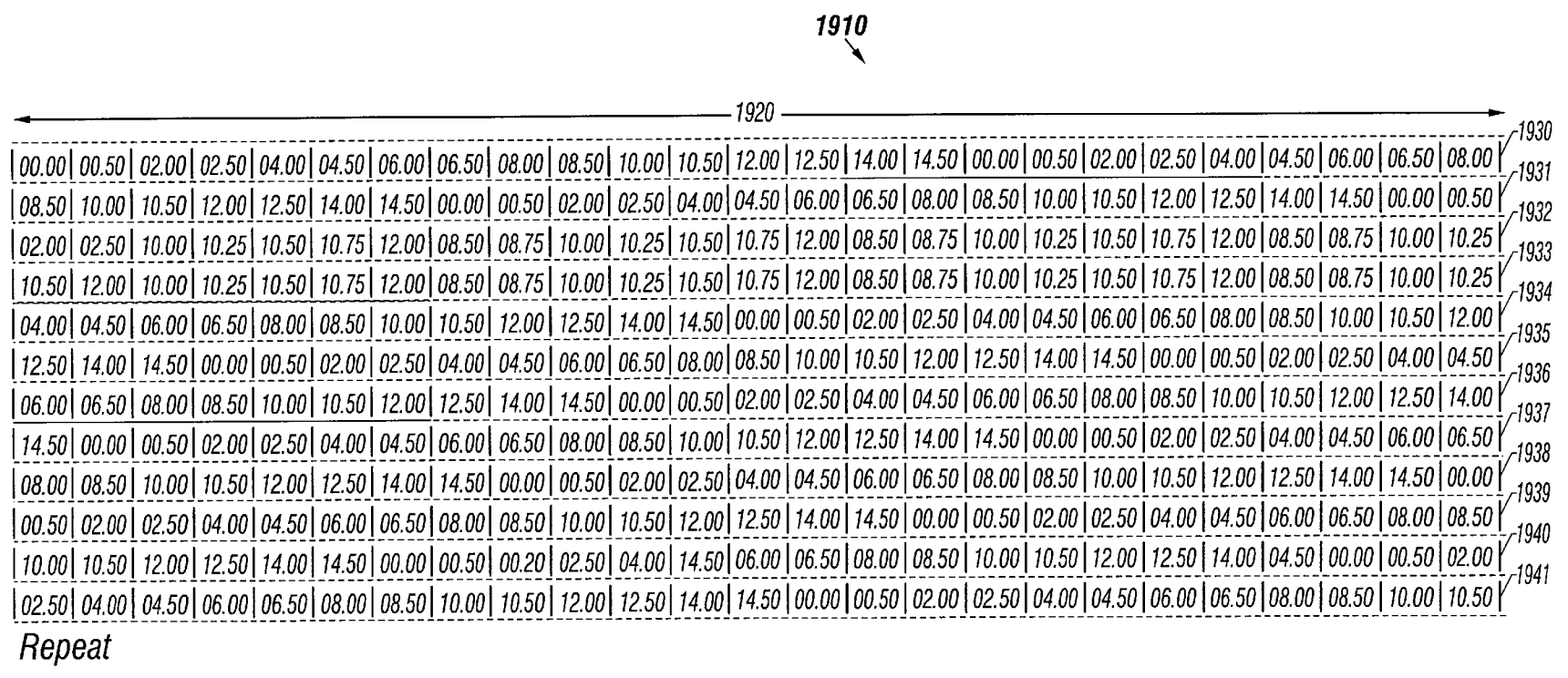

FIG. 19 illustrates an exemplary memory mapping configuration 1910 for a screen display mode having 800 pixels across the horizontal (e.g., x) and 600 pixels down the vertical (e.g., y) with each pixel containing 16 bpp. FIG. 19 illustrates tile memory configuration 1910 for the first 12 display lines, with each tile representing one-half of a row (e.g., four columns) of an array. There are 25 one-half row tiles per display line.

In this screen display, each display line (e.g., horizontal line of pixels) requires 800×16 or 12,800 bits of storage. As shown in FIG. 19, the horizontal or x-axis across the entire display screen of 800 pixels is illustrated as 1920. Since each row of the FB DRAM 304 contains 1024 bits, 12.5 rows (100 columns) are required to store each horizontal line of pixels in this display mode. In the first line 1930 of FIG. 19, the arrays that store these 12.5 rows are 0, 2, 4, 6, 8, 10, 12, 14, 0, 2, 4, 6, and 8.0, respectively. For ease of illustration, the tiles shown are of one-half row length. Analogously, for the second display line 1931, 12.5 rows are required to store the display information and they are from arrays 8.5, 10, 12, 14, 0, 2, 4, 6, 8, 10, 12, 14, and 0. The configuration 1910 is used to store the first 12 display lines 1930–1941. This same array configuration 1910 is repeated 50 times to cover all lines from line 13 to line 600; during the repetition, the array types change.

In an analogous fashion with respect to FIG. 16A, memory configuration 1910 updates the row value for each occurrence of a same array until all 256 rows of the array are utilized, at which time the array type value is incremented. The configuration is repeated 50 times and each array is used 19 times in the pattern; therefore, array types 0, 1, and 2 are fully used and part of array type 3 is used to store the screen data for this display mode. Memory mapping 1910 maintains the neighboring pixel rules defined with respect to FIG. 15.

Figure 20A:
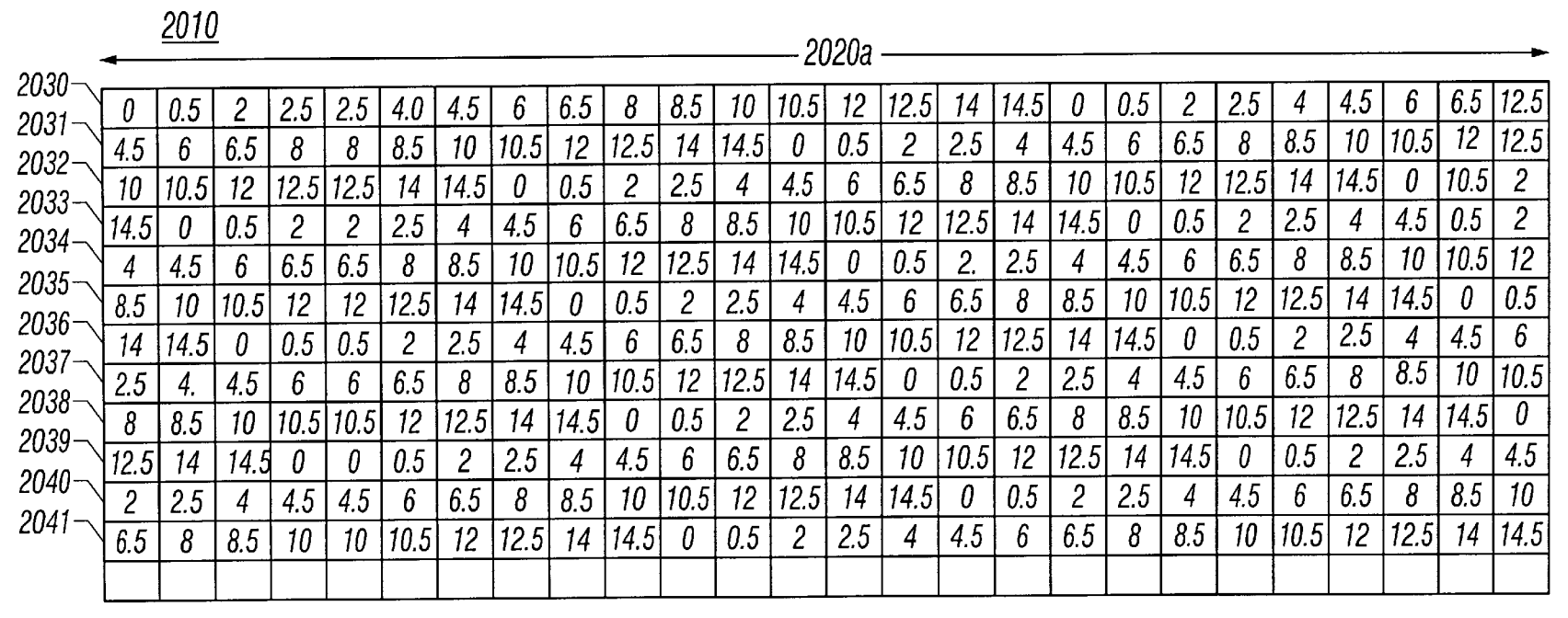
Figure 20B:
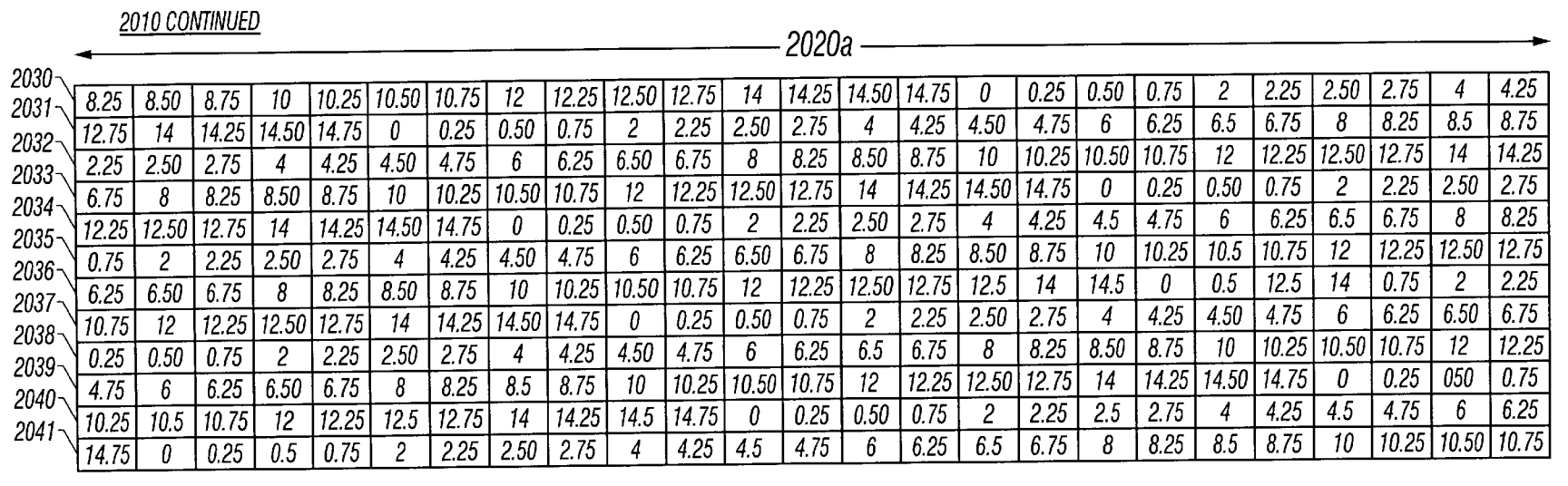

FIG. 20A and FIG. 20B illustrate the left and right sides, respectively, of an exemplary memory mapping configuration 2010 for a screen display mode having 800 pixels across the horizontal (e.g., x) and 600 pixels down the vertical (e.g., y) with each pixel containing 24 bits of data storage (bits per pixel, or bpp). Tile memory configuration 2010 is for the first 12 display lines, with each tile representing either one-quarter or one-half of a row of an array depending on the tile position. There are 50 tiles per display line.

In this screen display, each display line (e.g., horizontal line of pixels) requires 800×24 or 19,200 bits of storage. The horizontal or x-axis across the entire display screen of 800 pixels is illustrated as 2020a and 2020b. Since each row of the FB DRAM 304 contains 1024 bits, 19.25 rows (150 columns) are used to store each horizontal line of pixels in this display mode. In the first line 2030 (FIG. 20A and FIG. 20B) these 19.25 rows are stored in arrays 0, 2, 4, 6, 8, 10, 12, 14, 0, 2, 4, 6, 8, 10, 12, 14, 0, 2, and 4.25. For ease of illustration, the tiles shown are of one-half or one-quarter row length. Analogously, for the second display line 2031, 19.25 rows are required to store the display information and they are in arrays 4.5, 6, 8, 10, 12, 14, 0, 2, 4, 6, 8, 10, 12, 14, 0, 2, 4, 6, 8.75, respectively, for line 2031. The configuration 2010 to store the first 12 display lines 2030–2041 is shown. This same array configuration 2010 is repeated 50 times to cover all lines from line 13 to line 600; during the repetition, the array types change.

In an analogous fashion with respect to FIG. 16A, memory configuration 2010 updates the row value for each occurrence of a same array until all 256 rows of the array are utilized, at which time the array type value is incremented. The configuration 2010 is repeated 50 times and each array is used 28 times in the pattern; therefore, array types 0, 1, and 2, 3, 5 are fully used and part of array type 6 is used to store the screen data for this display mode. Memory mapping 2010 maintains the neighboring pixel rules defined with respect to FIG. 15.

Figure 21:
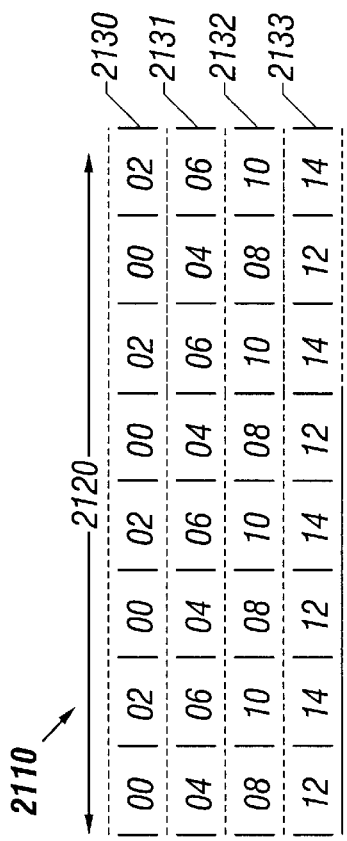
FIG. 21 is an illustration of a memory configuration utilized by an embodiment of the invention for computer system graphic display modes utilizing 1024 (horizontal)× 768 (vertical)×8 bits per pixel using 8 arrays per scan line.

FIG. 21 illustrates an exemplary memory mapping configuration for a screen display mode having 1024 pixels across the horizontal (e.g., x) and 768 pixels down the vertical (e.g., y) with each pixel containing 8 bpp. Tile memory configuration 2110 is used for the first 4 display lines, with each tile one row of an array. There are 8 tiles per display line.

In this screen display, each display line (e.g., horizontal line of pixels) requires 1024×8 or 8,192 bits of storage. The horizontal or x-axis across the entire display screen of 1024 pixels is illustrated as 2120. Since each row of the FB DRAM 304 contains 1024 bits, 8 rows are used to store each horizontal line of pixels in this display mode. The arrays that are selected to store these 8 rows for the first line 2130 are arrays 0 and 2, for line 2131 they are 4 and 6, for line 2132 they are 8 and 10 and for line 2133 they are 12 and 14. The configuration to store the first 4 display lines 2130–2133 is shown. This same array configuration 2110 is repeated 192 times to cover all lines from line 5 to line 768; during the repetition, the array types change.

In an analogous fashion with respect to FIG. 16A, the memory configuration 2110 updates the row value for each occurrence of a same array until all 256 rows of the array are utilized, at which time the array type value is incremented. Configuration 2110 is repeated 192 times and each array is used times in the pattern; therefore, array types 0, 1, and 2 are fully used store the screen data for this display mode. Memory mapping 2110 maintains the neighboring pixel rules defined with respect to FIG. 15.

Figure 22:
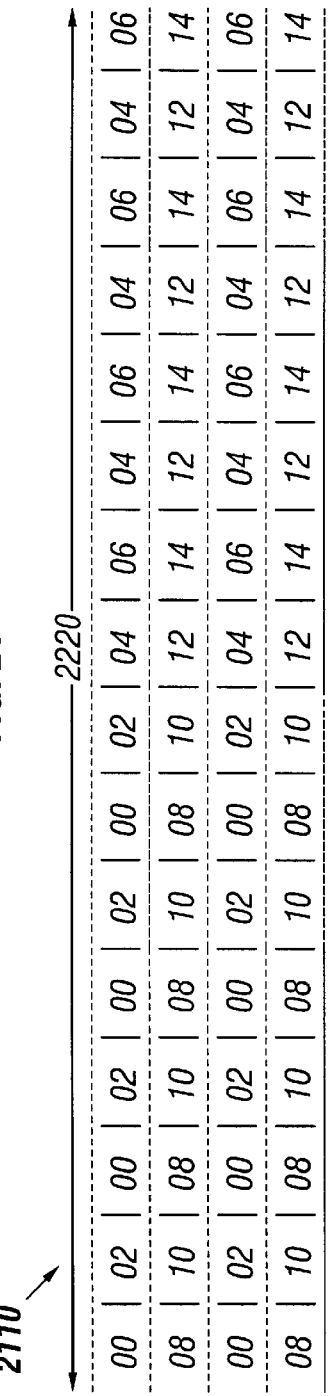
FIG. 22 is an illustration of a memory configuration utilized by an embodiment of the invention for computer system graphic display modes utilizing 1024 (horizontal)× 768 (vertical)×16 bits per pixel using 16 arrays per scan line.

FIG. 22 illustrates an exemplary memory mapping configuration 2210 for a screen display mode having 1024 pixels across the horizontal (e.g., x) and 768 pixels down the vertical (e.g., y) with each pixel containing 16 bits of data storage (bits per pixel, or bpp). Tile memory configuration 2210 is for the first 4 display lines, with each tile representing one row of an array. There are 16 tiles per display line.

In this screen display, each display line (e.g., horizontal line of pixels) requires 1024×16 or 16,384 bits of storage. The horizontal or x-axis across the entire display screen of 1024 pixels is illustrated as 2220. Since each row of the FB DRAM 304 contains 1024 bits, 16 rows are used to store each horizontal line of pixels in this display mode. The arrays that are selected to store these 8 rows for the first line 2230 are arrays 0, 2, 4, and 6 and for line 2231 they are 8, 10, 12, and 14. The configuration 2210 to store the first 4 display lines 2230–2233 is shown. This same array configuration is repeated 192 times to cover all lines from line 5 to line 768; during the repetition, the array types change.

In an analogous fashion with respect to FIG. 16A, memory configuration 2210 updates the row value for each occurrence of a same array until all 256 rows of the array are utilized, at which time the array type value is incremented. The pattern is repeated 192 times and each array is used 8 times in the pattern, therefore, array type 0, 1, 2, 3, 4, and 5 are fully used store the screen data for this display mode. Memory mapping 2210 maintains the neighboring pixel rules defined with respect to FIG. 15.

It is appreciated that due to the alternating nature of the mapping configurations of FIG. 21 and FIG. 22, they utilize translation fields defined within Table IV below in lieu of Table 1.

TABLE IV

| 20 | 19 | 12 11 | 7 6 | 4 3 | 0 |
|----|----|-------|-----|-----|---|
| A  | B  | C     |     | D   | E |

Where:
A = Array Type Field MSB (1 bit)
B = Page Number (8 bits)
C = Array Type Field LSB (2 bits) Plus Array Value (3 bits)
D = Column (3 bits)
E = Byte Number (4 bits)

Figure 23:
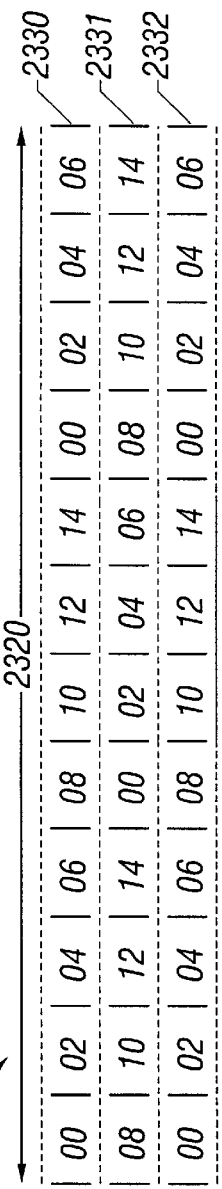
FIG. 23 is an illustration of a memory configuration utilized by an embodiment of the invention for computer system graphic display modes utilizing 1280 (horizontal)× 1024 (vertical)×8 bits per pixel using 12 arrays per scan line.

FIG. 23 illustrates an exemplary memory mapping configuration 2310 for a screen display mode having 1280 pixels across the horizontal (e.g., x) and 1024 pixels down the vertical (e.g., y) with each pixel containing 8 bits of data storage, bpp. Tile memory configuration 2310 is for the first 3 display lines, with each tile representing one row of an array. There are 12 tiles per display line.

In this screen display, each display line. (e.g., horizontal line of pixels) requires 1280×8 or 10,240 bits of storage. The horizontal or x-axis across the entire display screen of 1024 pixels is illustrated as 2320. Since each row of the FB DRAM 304 contains 1024 bits, 12 rows are used to store each horizontal line of pixels in this display mode. The arrays that are selected to store these 12 rows for the first line 2330 are arrays 0, 2, 4, 6, 8, 10, 12, 14, 0, 2, 4, and 6 and for line 2331 they are 8, 10, 12, 14, 0, 2, 4, 6, 8, 10, 12, and 14. The configuration 2310 to store the first 3 display lines 2330–2332 is shown. The first two lines of this array configuration are repeated 512 times to cover all lines from line 3 to line 1024; during the repetition, the array types change.

In an analogous fashion with respect to FIG. 16A, the memory configuration 231 0 updates the row value for each occurrence of a same array until all 256 rows of the array are utilized, at which time the array type value is incremented. The first two lines ofthe pattern 2310 are repeated 512 times and each array is used 3 times in the pattern; therefore, array type 0, 1, 2, 3, 4, and 5 are fully used store the screen data for this display mode. The memory mapping 2310 maintains the neighboring pixel rules defined with respect to FIG. 15. The address translation for configuration 2310 utilizes the fields of Table 1.

COMPUTER SYSTEM ENVIRONMENT

Figure 24:
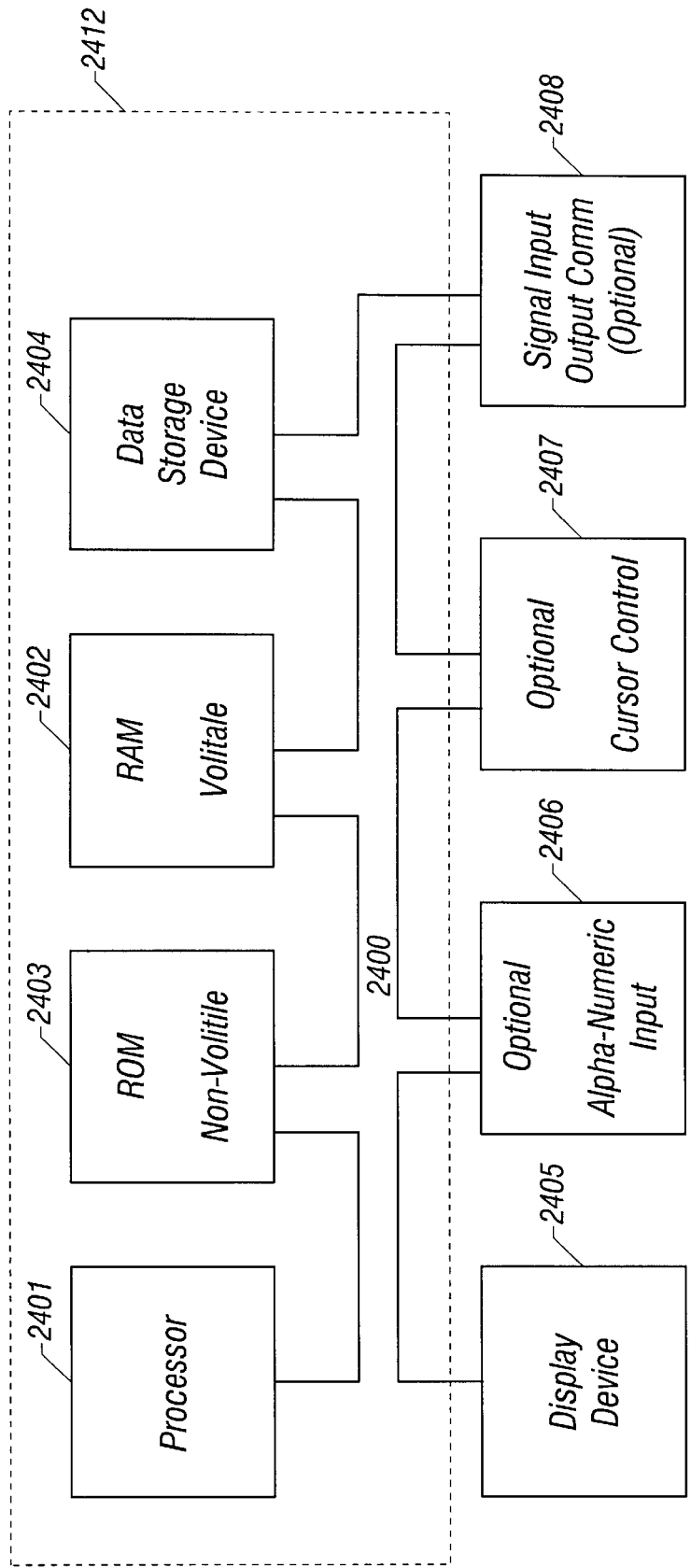
FIG. 24 is a logical block diagram of a general purpose computer system utilized in one embodiment of the invention.
Figure 25:
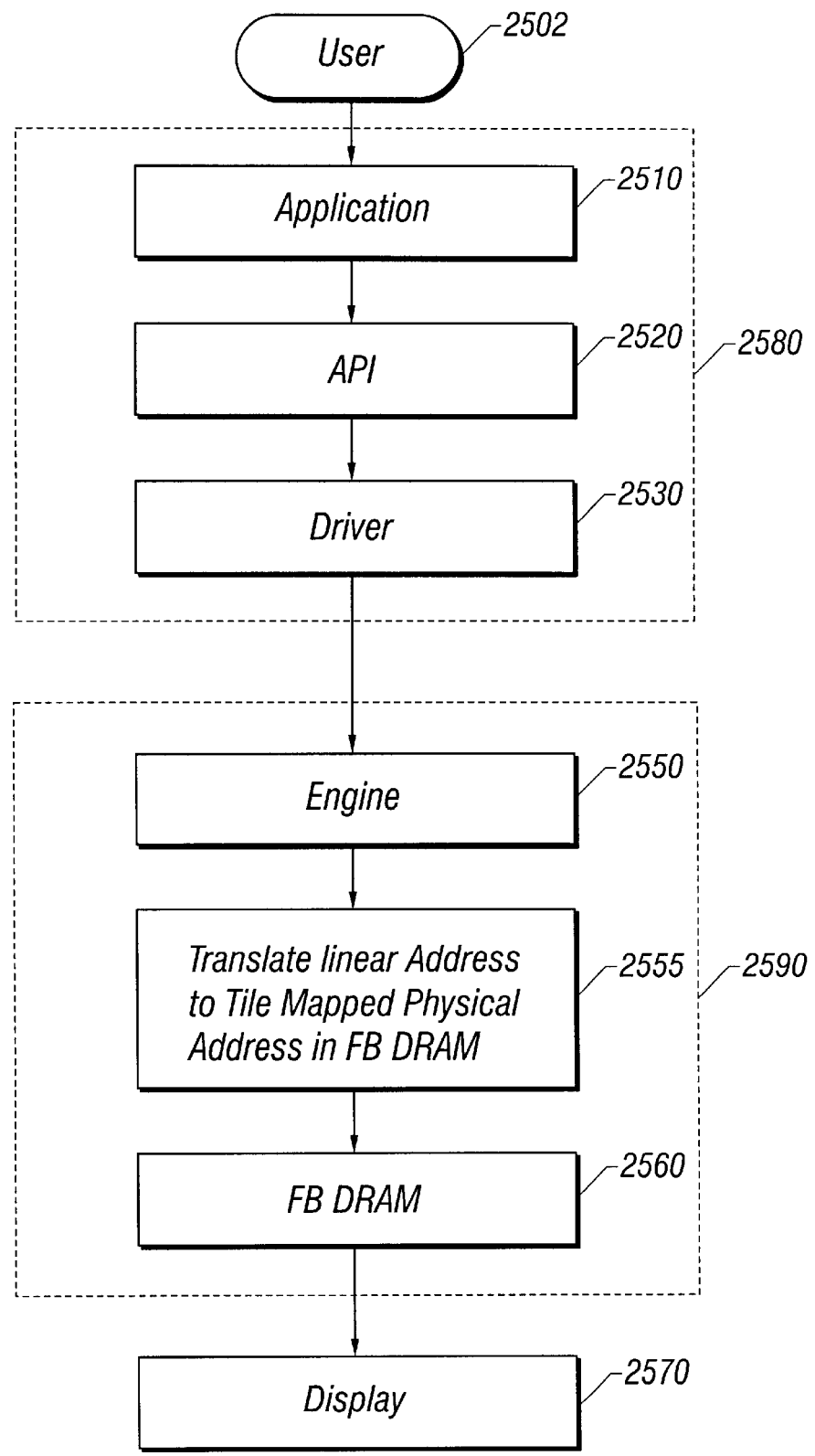
FIG. 25 is a logical flow diagram illustrating hardware and software layering within one embodiment of the invention.

Refer to FIG. 24 which illustrates a computer system 2412. Within discussions of the invention, memory address translation processes (e.g., process 2580) and steps are realized, in one embodiment, as a series of instructions (e.g., software program) that reside within computer readable memory units of system 2412 and executed by processors of system 2412. When executed, the instructions cause the computer system 2412 to perform specific actions and exhibit specific behavior which is described in detail to follow.

In general, computer system 2412 used by the invention comprises an address/data bus 2400 for communicating information, one or more central processors 2401 coupled with the bus 2400 for processing information and instructions, a computer readable volatile memory unit 2402 (e.g., random access memory, static RAM, dynamic RAM, etc.) coupled with the bus 2400 for storing information and instructions for the central processor(s) 2401, a computer readable nonvolatile memory unit (e.g., read only memory, programmable ROM, flash memory, EPROM, EEPROM, etc.) coupled with the bus 2400 for storing static information and instructions for the processor(s) 2401. System 2412 also includes a mass storage computer readable data storage device 2404 (hard drive or floppy) such as a magnetic or optical disk and disk drive coupled with the bus 2400 for storing information and instructions. Optionally, system 2412 can include a display device 2405 coupled to the bus 2400 for displaying information to the computer user, an alphanumeric input device 2406 including alphanumeric and function keys coupled to the bus 2400 for communicating information and command selections to the central processor(s) 2401, a cursor control device 2407 coupled to the bus for communicating user input information and command selections to the central processor(s) 2401, and a signal generating device 2408 coupled to the bus 2400 for communicating command selections to the processor(s) 2401. In one embodiment, system 2412 is a x86 architecture computer system well known in the art.

TILE MEMORY CONFIGURATION ADDRESS TRANSLATION PROCESS

FIG. 25 illustrates a general flow diagram 2505 used for rendering information onto a display 2405. User information is received at step 2502 by an application layer 2510. The application layer dictates the type of logical addressing performed for managing the memory of screen displayed information. An application interface or API, at step 2520, then facilitates the application in performing special operations such as high level graphics routines. At step 2530, a graphics driver interfaces with the API to perform hardware specific graphics routines for providing access to a hardware engine. It is appreciated that the steps within process 2580 are performed by computer system 2412.

At step 2550, a hardware engine performs graphics rendering functions and these functions interface with frame buffer information stored in FB DRAM 304. At step 2555, the invention performs translation of linear addresses to physical addresses, in the manner specified above, so that the advantageous memory mapping configurations of FIGS. 15–23 can be realized. In a preferred embodiment of the invention, this translation is performed in hardware using circuitry that, in one example, realizes a state machine. In an alternative embodiment of the invention, step 2555 is realized by program instructions. The interfacing with FB DRAM 304 occurs at step 2560. Finally, at step 2570, information is displayed on screen 2405 for visualization. The steps within process 2590 are performed by hardware, except as discussed above.

It is appreciated that the linear addresses received at step 2555 represent a memory mapping of the display screen 2405 and use sequential linear addresses. From these linear addresses, the row (e.g., page) number and the column number used by the invention are taken directly from the fields B and D, respectively; see Table I and Table IV. It is further appreciated that given the field information of Table I and Table IV, given the array type order information of Table III, and given the detailed memory configurations of FIG. 16A through FIG. 23, one of ordinary skill in the art can readily determine the particular translation functions used at step 2555. Once the linear addresses are translated to physical addresses, the invention writes and reads the pixel information into the FB DRAM 304 of the invention using the physical addresses.

DISTRIBUTED DRAM REFRESHING

The invention includes a distributed DRAM refresh method to lower electrical noise that may adversely affect digital circuitry associated with the DRAM. The entire contents of U.S. Pat. No. 5,781,200, issued Jul. 14, 1998, are hereby expressly incorporated by reference into the present application as if fully set forth herein.

DRAM uses a single transistor and capacitor to store each bit of data. SRAM (static random access memory) uses several transistors for each bit. No material is a perfect insulator and, therefore, the charge stored in the capacitor to represent, for example, a "1" slowly leaks through to the device substrate. This requires that the charge be periodically "refreshed" by performing a ROW activate cycle (read operation).

The ROW activate cycle loads the data from each bit in a ROW into the corresponding sense amplifiers and also causes the storage capacitor that corresponds to each loaded bit to regain any lost charge. Each bit of data must be periodically refreshed, so all the ROWs must be sequentially read (DRAM can activate only one ROW per "array" at any given moment). The refresh cycle has the same minimum cycle time requirements as a read cycle, which is typically approximately 8 memory clocks (MCLKs) for most DRAM controllers. Commodity DRAM typically has 16 K sense amplifiers per megabyte based on a 512 row architecture. Typically each ROW must be refreshed at the rate of once every 16 milliseconds.

Figure 26:
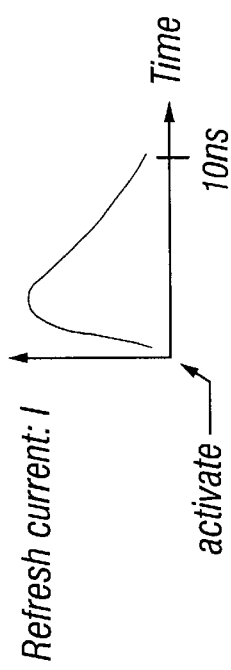
FIG. 26 illustrates refresh current as a function of time, representing an embodiment of the invention.

Referring to FIG. 26, a time domain display of the current (I) drawn by each sense amplifier during activation is depicted. This represents the current used to refresh each memory cell in any DRAM device. The total current used in approximately the first 10 nanoseconds after activation is approximately 125 microamps. For a 1K (1024 bit) sense amplifier block, this amounts to a current spike of approximately 128 milliamps. Given an embedded DRAM device with 64 1K sense amplifier blocks (e.g., 64 arrays composed of 256 1K memory cell rows), if one row of each array was refreshed during the same clock cycle, the resulting spike would amount to approximately 8.2 amps in approximately 10 nanoseconds. This large current spike is a significant potential problem for embedded DRAM devices.

In conventional DRAM this high current is supplied by external power supply capacitors and is not a problem, as no other operation is taking place with the DRAM device. However, with embedded DRAM devices, such a high current spike could easily affect the reference voltage for the large amount of logic on the device, thereby disturbing the processing that is associated with the embedded DRAM. The high current spike can be considered to be noise in the reference voltage. Therefore, what is needed is a solution that reduces the current spikes associated with refreshing the memory cells of embedded DRAM devices.

The invention includes a DRAM architecture based on a plurality of arrays. Each array can have, for example, 1K sense amplifiers. Alternatively, a single set of 1K sense amplifiers can be shared by some of the plurality of arrays. In either event, in this example, the architecture can be termed to be 1K sense amplifiers per ROW.

In contrast, commodity DRAM typically has 16K sense amplifiers per row since commodity DRAM is based on a single large array. In the case where the invention has 16 arrays, each with a 1K bit sense amplifier, the power required to activate a single row is 1/16 that of the power required to activate all 16 arrays. Thus, the power required per activate operation by the invention can be more than an order of magnitude lower compared to commodity DRAM.

Of course, the invention can be based on 8, 12, 24, 48, 64, 96, or any number of arrays. Similarly, the invention can be based on each array being composed by 256, 512, 1024, or any number of rows.

The "group" of DRAM arrays share a common data bus and share activate and R/W control. In addition, the arrays can be arranged into 2, 3, 4, or any number of sub-groups and each sub-group can be refreshed completely (all rows) before performing refresh on the other sub-groups. A significant advantage of sub-grouping the arrays is that, even when the arrays in one sub-group are undergoing activation (refresh), one of the arrays in the other sub-group(s) that are not undergoing activation (refresh) can be undergoing simultaneously read/write operations. Thus, the invention permits a significant improvement in performance due to the simultaneous activate and read/write capability.

Given a set of 16 arrays and a system requirement of 8 clock cycles before you can activate a new row in an array that has had a row refreshed, implementing the distributed DRAM refreshing method one row at a time results in a noise reduction of 1:16 while the required number of clock cycles is twice as high compared to commodity DRAM. Similarly, implementing the distributed DRAM refreshing two rows at a time results in a noise reduction of 1:8 while the required number of clock cycles is the same as commodity DRAM. The refresh could be performed in less than 8 clock cycles.

Figure 27:
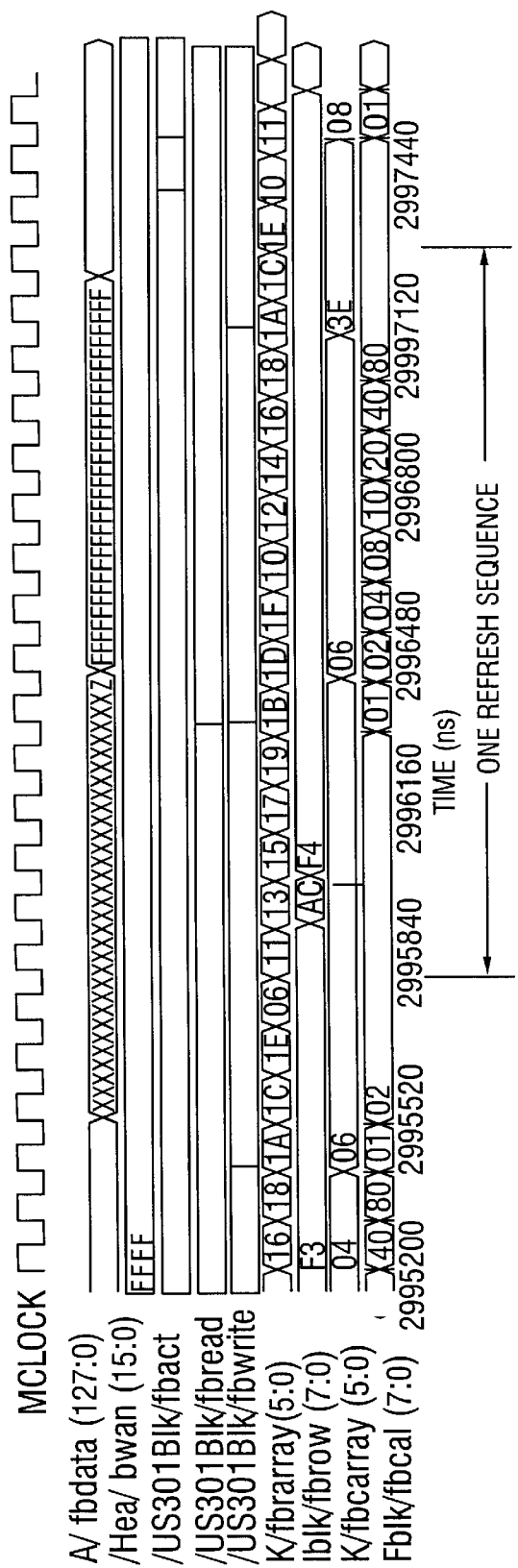
FIG. 27 illustrates a timing diagram for the same row number being refreshed (activated) in a sequence of arrays, representing an embodiment of the invention.

Referring now to FIG. 27, a timing diagram for a specific embodiment of the distributed DRAM refresh approach is illustrated. In this embodiment, a row of sense amplifiers is shared between two arrays (e.g., 1C and 1D). The device that is based on this embodiments has 48 arrays which are refreshed in three bursts, based on the 48 arrays being arranged into 3 sub-groups of 16 arrays each. Significantly, the sub-groups that are not being refreshed may contain an array that is undergoing read/write operations at the same time that the refresh (activate) operation(s) are taking place within arrays that compose the other sub-group.

FIG. 27 shows the same row number (fbrow: F4) being activated (refreshed) in a sequence of arrays. The sequence of arrays labeled "one refresh sequence" is: 11, 13, 15, 17, 19, 1B, 1D, 1F, 10, 12, 14, 16, 18, 1A, 1C, 1E. One row is refreshed each clock cycle during this "one refresh sequence." A similar refresh cycle is shown earlier in the timing diagram, separated by an activate on Array 06, Row AC. Subsequently in the timing diagram, columns 1 through 8 of array 06 are written with 1's.

The refresh can be decomposed into a pipelined activate command by external logic. If there is no other command queued, the refresh pipelined activate command can be in burst form. In this case, assuming a sub-group of 8 arrays, the granularity of the burst activate command will be 8. There can be a 21-bit counter with a programmable pre-load value to control the refresh interval (e.g., 16 milliseconds) for various possible internal clock rates.

Thus, the invention includes a method of distributed DRAM refreshing comprising: refreshing a first row of memory cells in a first array of DRAM memory cells with a first row of sense amplifiers; and then refreshing a second row of memory cells in a second array of DRAM memory cells with a second row of sense amplifiers. In this method, the first row of memory cells can have a row number and the second row of memory cells can have an identical row number. This method can also include refreshing a third row of memory cells in the first array of DRAM memory cells with the first row of sense amplifiers, after refreshing the second row of memory cells; and then refreshing a fourth row of memory cells in the second array of DRAM memory cells with the second row of sense amplifiers. In this case, the third row and the fourth row can have an identical row number. In this method the first array and the second array can compose a first sub-group of arrays, and the method can also include performing a read/write operation on a third row of memory cells in a third array of DRAM memory cells, the third array of DRAM memory cells composing a second sub-group of arrays. In this method refreshing the first row of memory cells can be performed during a first clock cycle and refreshing the second row of memory cells can be performed during a second clock cycle, the first clock cycle and the second clock cycle defining a sequence.

The invention also includes a method of distributed DRAM refreshing comprising: refreshing a first row of memory cells in a first array of DRAM memory cells with a first row of sense amplifiers; refreshing a second row of memory cells in a second array of DRAM memory cells with the first row of sense amplifiers; and performing a read/write operation on a third row of memory cells in a third array of DRAM memory cells with a second row of sense amplifiers, wherein the first array and the second array compose a first sub-group of arrays and the third array of DRAM memory cells compose a second sub-group of arrays. In this method the first row of memory cells can have a row number and the second row of memory cells can have an identical row number. This method can also include refreshing a third row of memory cells in the first array of DRAM memory cells with the row of sense amplifiers, after refreshing the second row of memory cells; and then refreshing a fourth row of memory cells in the second array of DRAM memory cells with the row of sense amplifiers. In this case, the third row and the fourth row can have an identical row number The invention also includes a semiconductor device comprising: a first array of DRAM memory cells; a first row of sense amplifiers coupled to the first array of DRAM memory cells; a second array of DRAM memory cells; and a second row of sense amplifiers coupled to the second array of DRAM memory cells, wherein a first row of DRAM memory cells in the first array of DRAM memory cells can be undergoing a first refresh operation at the same time that a second row of DRAM memory cells in the second array of DRAM memory cells is undergoing a second refresh operation. In this semiconductor device the first array of DRAM memory cells, the first row of sense amplifiers, the second array of DRAM memory cells, and the second row of sense amplifiers can compose a single semiconductor chip. This semiconductor device can also include a controller coupled to both the first row of sense amplifiers and the second row of sense amplifiers. This semiconductor device can also include a circuit adapted to perform a read/write operation to the first array of DRAM memory cells while simultaneously activating the second array of DRAM memory cells. In this semiconductor device the first array and the second array can compose a first sub-group of arrays, and the semiconductor device can also include a third array of DRAM memory cells composing a second sub-group of arrays, wherein a row of DRAM memory cells in the third array can undergo a read/write operation at the same time that both the first array of DRAM memory cells and the second array of DRAM memory cells is undergoing a refresh cycle.

The invention also includes an embedded DRAM memory comprising: a first array of DRAM memory cells; a first row of sense amplifiers coupled to the first array of DRAM memory cells; a second array of DRAM memory cells; a second row of sense amplifiers coupled to the second array of DRAM memory cells; and a circuit adapted to preform a read/write operation to the first array of DRAM memory cells while simultaneously activating the second array of DRAM memory cells, wherein the first array of DRAM memory cells, the first row of sense amplifiers, the second array of DRAM memory cells, the second row of sense amplifiers, and the circuit compose a single semiconductor chip. This embedded DRAM memory can also include a controller coupled to the row of sense amplifiers.

ADDRESS LOOKUP DRAM AGING

Another use of the multi-array embedded DRAM is for the storage and management of Ethernet card addresses in a network switch controller device. Under many circumstances, it may be useful to purge old data from the address lookup table DRAM, such as where the address data in the DRAM of a network switcher needs to be periodically purged of old (aged) addresses.

The invention includes the use of the DRAM refresh cycle in a network data-switcher device to efficiently implement an "auto-age" function. Thus, every mth refresh cycle becomes an auto-age refresh cycle.

More specifically, a special refresh cycle can be used on an interval basis to perform the required "auto-age" function for the DRAM based network address storage memory. This approach uses one required function (i.e., refresh) to simultaneously perform another required function (i.e., "auto-age"), thereby improving overall performance.

There is a refresh time counter for a refresh period of, for example, approximately 16 milliseconds. There is an aging counter that counts refresh periods and marks some as "auto-age" refresh periods. For example, every 6400 refresh periods, or every 100 seconds. When the refresh time counter and the aging counter are both ready, there is a R-M-W cycle performed on the ROW after it is loaded into the ROW of sense amplifiers.

This combination of refresh and auto-age operations is particularly advantageous where the network address lookup memory includes multiple arrays of DRAM. Further, this combination of operations is even more advantageous where the device that hosts the network address lookup memory includes a plurality of sub-groups of such multiple arrays or where there are a plurality of sub-groups and some of the sub-groups are not being used for address lookup purposes.

Preferred embodiments of the invention use a conditional read-modify-write (R-M-W) cycle that can operate on only a few bits in each column. It is conditional in that some of the data read from each address entry may change some of the data that is to be written back. Further, this conditional R-M-W cycle can operate across an entire sense amplifier width (ROW). This is important because a single ROW can accommodate address lookup data for more than one address. In this way, a number of address lookup entries can be auto aged during a single operation.

Figure 28:
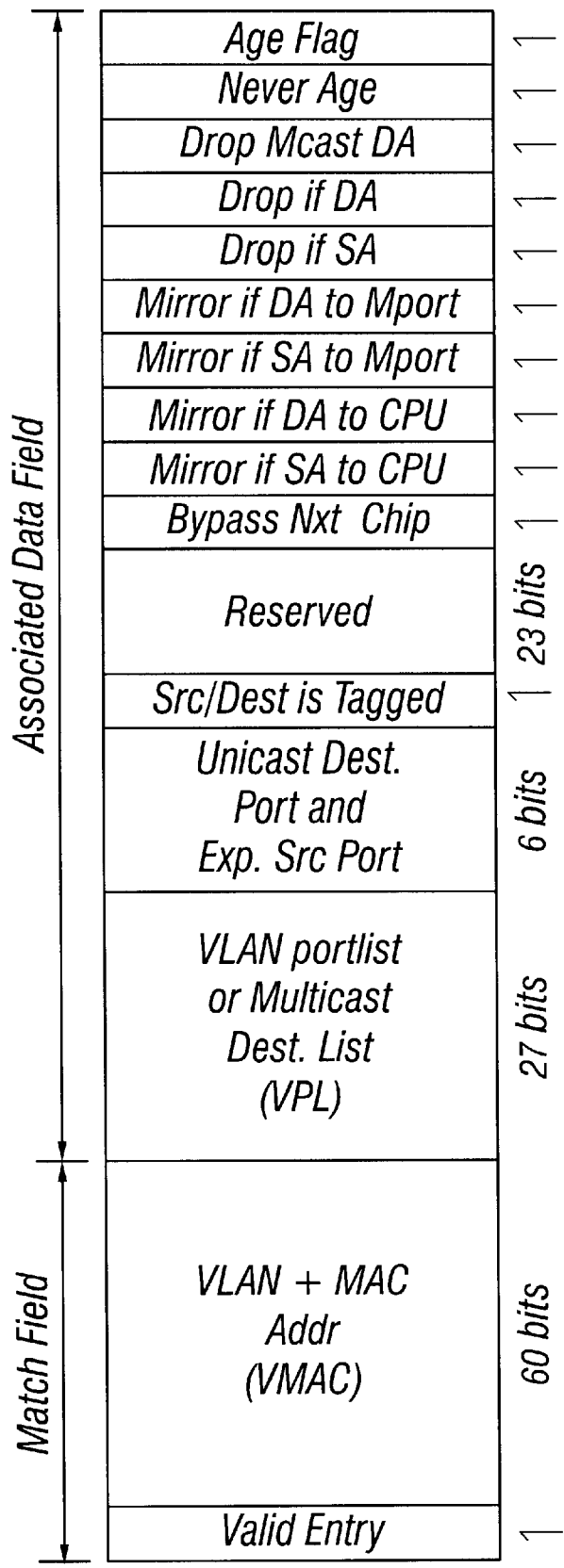
FIG. 28 illustrates a block diagram of a 128 bit address lookup entry, representing an embodiment of the invention.

Referring now to FIG. 28, a 128 bit address lookup entry is illustrated. Eight such addresses can be accommodated simultaneously by a single 1024 bit ROW. It can be appreciated that a larger ROW could accommodate even more addresses simultaneously. Thus, a single row of sense amplifiers can be loaded with data for several addresses (e.g., 8 addresses corresponding to 8 columns of 128 bits each to fill a 1024 bit ROW) and the R-M-W cycle can logically operate on just a few (e.g., 3) bits in each of the 8 columns.

Still referring to FIG. 28, in more detail, each 1024 bit ROW contains 8 network address entries of 128 bits each. The age function operates on only three bits in each of the 8 entries. These three bits can be termed: permanent; valid; and aged.

In FIG. 28 the permanent bit is termed "Never Age." The permanent bit is read during the "auto-age" and will protect the other two bits if it is set, for example by a host central processor unit. In FIG. 28, the permanent bit is bit 1 and if this bit is set, then this is a permanent entry that cannot be aged out by the auto-age block.

In FIG. 28, the valid bit is termed "Valid Entry." The valid bit indicates that this address is real (i.e., the address has been written, or learned, due to some data transfer at some time in the past). In FIG. 28, the valid bit is bit 127 and is set to "1" when the entry is active/valid.

In FIG. 28, the aged bit is termed "Age Flag." The aged bit indicates an address that has not been recently matched during network operations. In FIG. 28, the aged bit is bit 0 and when the source address matches this entry, then this bit is cleared to "0" indicating that the corresponding host is still attached and is active. Periodically, the auto-age block sets all of these aged bits to "1" and then monitors them at a later time. The aged bit is cleared whenever an address match occurs. An address match occurs when the switch device receives a data packet with a source address that has been previously learned. The aged bit is set by the auto-age operation. If the aged bit is already set ("1") when auto-age occurs, the valid bit is cleared. If the aged bit is "0" when auto-age occurs it indicates that the address entry is still active (i.e., the address has been used for a network data transfer at some time since the previous auto-age cycle). The auto-age operation will then set the age bit to indicate a new age cycle.

In this way, the auto-age operation piggybacks on the refresh operation. Both the refresh cycle and the auto-age refresh cycle can be done in bursts that take as many clock cycles as there are arrays. For example, given a sub-group of 8 arrays, for a single common row number, the auto-age refresh cycle can be performed as a burst of 8 activates over 8 MCLKs. The burst process can be repeated as many times as there are rows in each array, each time operating on a different common row.

Figure 29:
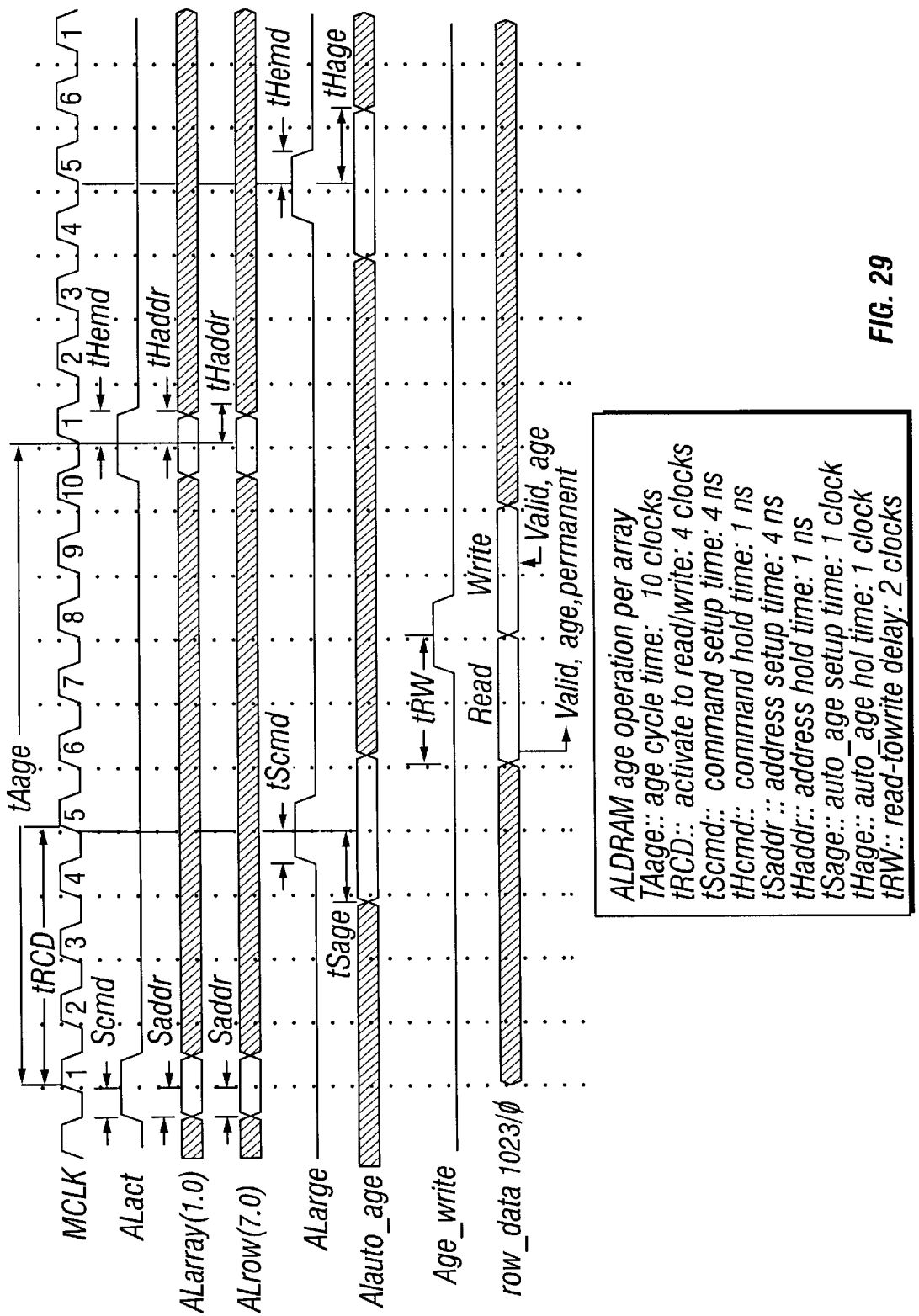
FIG. 29 illustrates a timing diagram of a address lookup DRAM auto-aging operation for one row of an array of DRAM memory cells, representing an embodiment of the invention.
Figure 30:
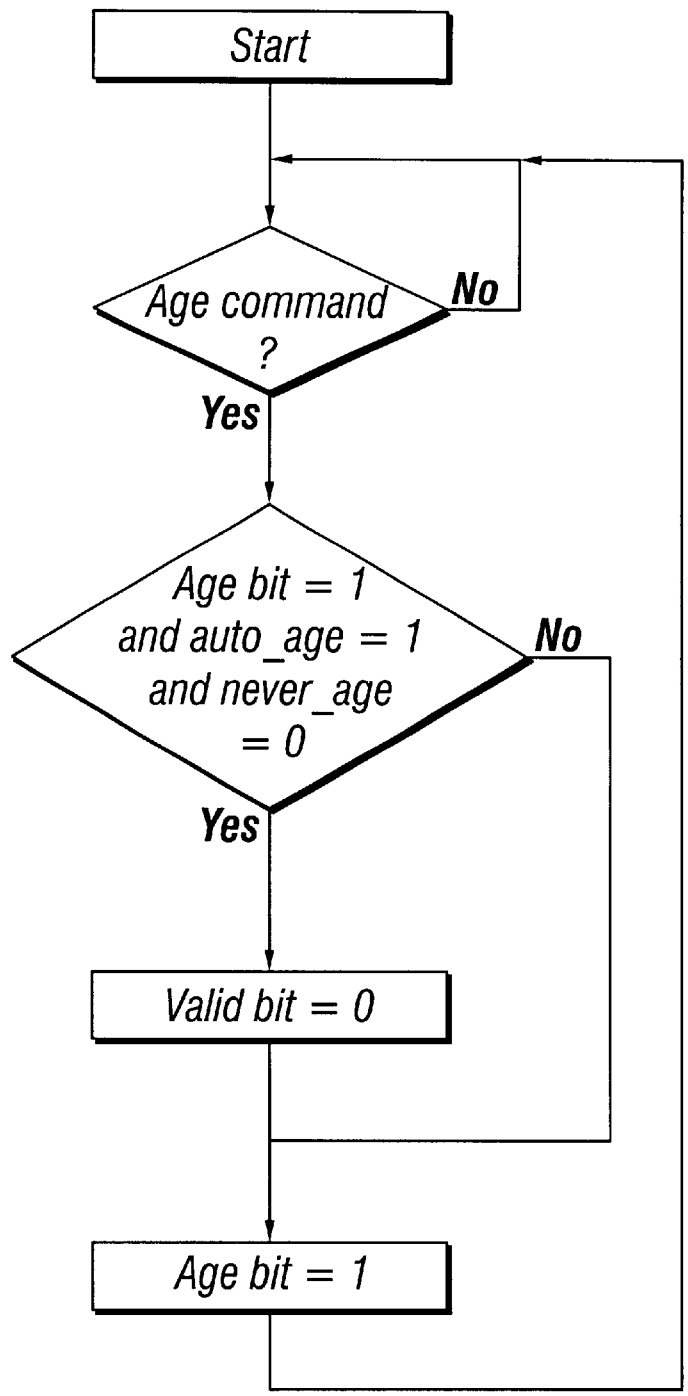
FIG. 30 illustrates a state diagram for the conditional read-modify-write (RMW) operation performed on a DRAM row containing 8 address entries, representing an embodiment of the invention.

The aging command is a special refresh scheme (e.g., burst 8 arrays with the same row number) because it is synchronized and combined with the refresh. Typically, refresh can be performed every 16 milliseconds whereas age can be performed on an interval of from several minutes to several hours. The age command can be a row based operation (command affects entire addressed row). The age command can be pipelined among the arrays. Referring now to FIG. 29 a timing diagram for an address lookup DRAM age operation on one array is illustrated. The age command can include an activation phase followed by a R-M-W phase on, for example, 8 age bits and 8 valid bits at one time. The write phase can always set the 8 age bits within such a row. Thus, a signal "auto_age" can enable an operation to clear 8 valid bits, if the corresponding age bit is set (e.g., "1") and the corresponding permanent bit is deasserted (e.g., "0"). Alternatively, if the age bit is not set (e.g., "0"), the auto age function will change the age bit to "1." See FIG. 30. As noted above, there can be a 21-bit counter that counts memory clocks (cycles) up to a programmable pre-load value to control the refresh interval (e.g., 16 milliseconds) for various possible internal clock rates. There can be another 24-bit counter clocked by refresh tick with a programmable pre-load value to do the auto-age timing. It can span from 16 milliseconds all the way up to 74 hours for the auto-age interval. When the auto-age interval happens, it can replace (or augment) the refresh operation at the next refresh command.

Thus, the invention includes a method of aging an entry in a DRAM memory comprising: refreshing a row of memory cells in a first array of DRAM memory cells, wherein refreshing periodically includes aging an entry that is stored in the row of memory cells. In this method, aging can include a conditional read-modify-write operation on a subset of bits that compose the entry. In this method, the row of memory cells can store a plurality of entries and refreshing can include aging at least two of the plurality of entries. In this method, aging the entry can include performing a read-modify-write operation with closely coupled logic that writes to a set of sense amplifiers that are associated with the array. In this method, the entry can be a network address lookup. This method can also include: refreshing another row of memory cells in a second array of DRAM memory cells, wherein refreshing the another row includes aging another entry that is stored in the another row of memory cells. In this case, the array of DRAM memory cells and the another array of DRAM memory cells compose a group of arrays and, further comprising, performing a read/write operation on another groups of arrays simultaneously with aging the entry.

PRACTICAL APPLICATIONS OF THE INVENTION

A practical application of the invention that has value within the technological arts is dynamic random access memory embedded in a general purpose computing integrated circuit. Further, the invention is useful in conjunction with embedded DRAM memories in network switches (such as are used for the purpose of controlling local area networks), or in conjunction with video boards (such as are used for the purpose of generating personal computer graphics), or the like. There are virtually innumerable uses for the invention, all of which need not be detailed here.

ADVANTAGES OF THE INVENTION

A circuit, representing an embodiment of the invention, can be cost effective and advantageous for at least the following reasons. The distributed DRAM refreshing reduces the noise caused by instantaneous current spikes due to DRAM refresh by producing a number of smaller current spikes, thereby spreading the smaller current spikes over a longer time. The distributed DRAM refreshing also permits increased performance by distributing the refresh (activate) operation among a plurality of sub-groups of arrays (e.g., 16 arrays out of a 64 array "group") and allowing simultaneous Read/Write access to arrays in the sub-groups that are not being refreshed. This is another use of the simultaneous Read/Write and Activate feature discussed in more detail above.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be assembled in the disclosed configuration, but could be assembled in virtually any configuration. Further, although the circuit described herein can be a physically separate module, it will be manifest that the circuit may be integrated into the apparatus with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A method of performing an auto-age function on an entry in an array of DRAM memory cells that are periodically refreshed by a ROW activate operation sequentially performed on each row of said array of DRAM memory cells, comprising:
    changing a refresh function to a read-modify-write cycle every mth refresh cycle, wherein m is an integer greater than 1 and a modify portion of said read-most-write cycle includes a test conditional set/clear function performed on a subset of bits composing said entry.

2. The method of performing an auto-age function on an entry according to claim 1, wherein said row of memory cells stores a plurality of entries and refreshing includes performing an auto-age function on at least two of said plurality of entries.

3. The method of performing an auto-age function on an entry according to claim 1, wherein said read-modify-write cycle is performed with closely coupled logic that writes directly to a set of sense amplifiers that are associated with a current row that composes said array.

4. The method of performing an auto-age function on an entry according to claim 1, wherein said entry is a network address and associated data.

5. The method of performing an auto-age function on an entry according to claim 1, further comprising: refreshing another row of memory cells in another array of DRAM memory cells, wherein refreshing said another row includes performing an auto-age function on another entry that is stored in said another row of memory cells.

6. The method of performing an auto-age function on an entry according to claim 5, wherein said array of DRAM memory cells and said another array of DRAM memory cells compose a group of arrays and, further comprising, performing a read/write operation on another group of arrays simultaneously with performing an auto-age function on said entry.

* * * * *

UNITED STATES PATENT AND TRADEMARK OFFICE
CERTIFICATE OF CORRECTION

PATENT NO.      : 6,230,235 B1                                    Page 1 of 1
DATED           : May 8, 2001
INVENTOR(S)     : Lu et al.

It is certified that error appears in the above-identified patent and that said Letters Patent is hereby corrected as shown below:

Column 30,
Line 25, please delete "read-most-write" and insert -- read-modify-write -- therefor.

Signed and Sealed this

Seventeenth Day of June, 2003

JAMES E. ROGAN
*Director of the United States Patent and Trademark Office*